(12) United States Patent
Liu et al.

(10) Patent No.: US 8,259,895 B2
(45) Date of Patent: Sep. 4, 2012

(54) BIDIRECTIONAL SHIFTER REGISTER AND METHOD OF DRIVING SAME

(75) Inventors: Sheng-Chao Liu, Hsinchu (TW); Kuang-Hsiang Liu, Hsinchu (TW); Chien-Chang Tseng, Hsinchu (TW); Tsang-Hong Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/330,489

(22) Filed: Dec. 19, 2011

(65) Prior Publication Data

US 2012/0087461 A1 Apr. 12, 2012

Related U.S. Application Data

(62) Division of application No. 12/685,294, filed on Jan. 11, 2010, now Pat. No. 8,102,962.

(51) Int. Cl.
*G11C 19/00* (2006.01)
(52) U.S. Cl. ............................................. 377/64; 377/69
(58) Field of Classification Search ........................ None
See application file for complete search history.

(56) References Cited

U.S. PATENT DOCUMENTS

| | | | |
|---|---|---|---|
| 6,418,182 B1* | 7/2002 | Suyama et al. | 377/69 |
| 6,963,327 B2* | 11/2005 | Kawahata et al. | 345/100 |
| 7,366,274 B2* | 4/2008 | Tseng et al. | 377/64 |
| 7,636,412 B2* | 12/2009 | Tobita | 377/64 |
| 2008/0219401 A1* | 9/2008 | Tobita | 377/79 |
| 2009/0206909 A1* | 8/2009 | Chen et al. | 327/427 |
| 2010/0067646 A1* | 3/2010 | Liu et al. | 377/69 |

* cited by examiner

*Primary Examiner* — Tuan T Lam
(74) *Attorney, Agent, or Firm* — Morris Manning & Martin LLP; Tim Tingkang Xia, Esq.

(57) ABSTRACT

A bidirectional shift register includes first, second, third and fourth control signal bus lines for providing first, second, third and fourth control signals, Bi1, Bi2, Bi3 and Bi4, respectively, and a plurality of shift register stages electrically coupled in serial, each shift register stage having first and second input nodes, where the shift register stages are grouped into a first section and a second section, where the first and second input nodes of each shift register stage in the first section are electrically coupled to the first and second control signal bus lines for receiving the first and second control signals Bi1 and Bi2, respectively, and the first and second input nodes of each shift register stage in the second section are electrically coupled to the third and fourth control signal bus lines for receiving the third and fourth control signals Bi3 and Bi4, respectively.

27 Claims, 13 Drawing Sheets

BIDIRECTIONAL SHIFTER REGISTER AND METHOD OF DRIVING SAME

CROSS-REFERENCE TO RELATED APPLICATION

This application is a divisional application of, and claims benefit of U.S. patent application Ser. No. 12/685,294, filed Jan. 11, 2010, entitled "BIDIRECTIONAL SHIFTER REGISTER AND METHOD OF DRIVING SAME," by Sheng-Chao Liu et al., now U.S. Pat. No. 8,102,962, the disclosure of which is hereby incorporated herein in its entirety by reference.

FIELD OF THE INVENTION

The present invention relates generally to a shift register, and more particularly, to a bidirectional shift register with four control signals.

BACKGROUND OF THE INVENTION

A liquid crystal display (LCD) includes an LCD panel formed with liquid crystal cells and pixel elements with each associating with a corresponding liquid crystal cell. These pixel elements are substantially arranged in the form of a matrix having gate lines in rows and data lines in columns. The LCD panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for aligning states of the liquid crystal cells on the LCD panel to control light transmittance therethrough, thereby displaying an image on the LCD.

In such a driving circuit, a bi-directional shift register is usually utilized in the gate driver to generate the plurality of gate signals for sequentially driving the gate lines, so as to allow a positive or a reverse display image. Typically, a plurality of 2-to-2 bidirectional control circuits is employed in the bi-directional shift register to control the scanning direction, forward or backward, of the plurality of gate signals.

FIG. 1 illustrates a conventional bi-directional shift register, where the 2-to-2 bidirectional control circuit has two input terminals P and N, and two output terminals D1 and D2, and are operably controlled by two control nodes Bi and XBi. The control nodes Bi and XBi are two DC signals set to have opposite polarities, such as a high level voltage and a low level voltage.

FIG. 2 shows a conventional two-way shift register with a set of shift register circuits $S_1$ to $S_N$. The control signal lines Bi1 and Bi2 receive two complementary control voltage signals directed to each control node Bi and XBi. When the control node Bi receives, from the control signal line Bi1, a control voltage signal of a high level voltage level, the control node XBi would complementary receive, from the control signal line Bi2, a control voltage signal of a low level voltage level. Likewise, when the control node XBi receives, from the control signal line Bi2, a control voltage signal of a high level voltage level, the control node Bi would complementary receive, from the control signal line Bi1, a control voltage signal of a low level voltage level.

However, over a period of time, transistors in shift register circuits $S_1$ to $S_N$ connected to Bi or XBi would deteriorate due to electrical degradation caused by the high level voltage. Such deterioration or degradation of electrical characteristics, particularly for amorphous silicon (a-Si) components, is likely to lead to a circuit breakdown or operation failure.

Therefore, a heretofore unaddressed need exists in the art to address the aforementioned deficiencies and inadequacies.

SUMMARY OF THE INVENTION

The present invention, in one aspect, relates to a bidirectional shift register. In one embodiment, the bidirectional shift register comprises first, second, third and four control signal bus lines for providing first, second, third and fourth control signals, Bi1, Bi2, Bi3 and Bi4, respectively, and a plurality of shift register stages electrically coupled in serial, each shift register stage having a first input node, a second input node and an output node, wherein the first through K-th shift register stages of the plurality of shift register stages is grouped into a first section and the (K+1)-th through M-th shift register stages of the plurality of shift register stages is grouped into a second section such that each of the first and second sections comprises a corresponding number of consecutive shift register stages, wherein K is an integer greater than 1 but less than the number, M, of the plurality of shift register stages, wherein the first and second input nodes of each shift register stage in the first section are electrically coupled to the first and second control signal bus lines for receiving the first and second control signals Bi1 and Bi2, respectively, and wherein the first and second input nodes of each shift register stage in the second section are electrically coupled to the third and fourth control signal bus lines for receiving the third and fourth control signals Bi3 and Bi4, respectively.

In one embodiment, each shift register stage further has third and fourth input nodes configured to receive a first clock signal, CK, and a second clock signal, XCK, respectively, wherein each clock signal comprises an AC signal characterized with a period, $T_{CK}$ and a phase, and the periods of the first and second clock signals are substantially identical, and the phases of the first and second clock signals are substantially reversed, wherein the period $T_{CK}$ is much shorter than a gate line period, $T_{GL}$, defined by the active scanning time during a frame.

The first and second control signals Bi1 and Bi2, and the third and fourth control signals Bi3 and Bi4 are adapted for respectively controlling the first and second sections of the shift register in a forward scanning operation or a backward scanning operation.

During the forward scanning operation, each of the first and third control signals Bi1 and Bi3 comprises an AC signal characterized with a waveform having a high level voltage defining a duration, T, and a low level voltage, wherein the duration T satisfies $T=(T_{GL}/2+2S)$ and $2S \geq T_{CK}$, wherein S is a half of an overlap time 2S between the high level voltage duration of the first control signal Bi1 and the high level voltage duration of the third control signal Bi3, and the third control signal Bi3 is shifted from the first control signal Bi1 by $T_{GL}/2$ such that the high level voltage duration of the first control signal Bi1 and the high level voltage duration of the third control signal Bi3 are overlapped by 2S, and the rising time of the first control signal Bi1 is earlier than the beginning of the active scanning time during a frame by a half of the overlap time 2S and the falling time of the third control signal Bi3 is later than the end of the active scanning time during a frame by a half of the overlap time 2S. Each of the second and fourth control signals Bi2 and Bi4 comprises a DC signal with a low level voltage.

During the backward scanning operation, each of the first and third control signals Bi1 and Bi3 comprises a DC signal with a low level voltage, and each of the second and fourth control signals Bi2 and Bi4 comprises an AC signal characterized with a waveform having a high level voltage defining a duration, T, and a low level voltage, wherein the duration T satisfies $T=T_{GL}/2+2S$, and the second control signal Bi2 is shifted from the fourth control signal Bi4 by $T_{GL}/2$ such that the rising time of the fourth control signal Bi4 is earlier than the beginning of the active scanning time during a frame by a half of the overlap time 2S and the falling time of the second control signal Bi2 is later than the end of the active scanning time during a frame by a half of the overlap time 2S.

In one embodiment, each shift register stage comprises a first transistor T1 having a gate electrically coupled to the output node of its immediately prior shift register stage, a drain electrically coupled to the first input node, and a source; a second transistor T2 having a gate electrically coupled to the output node of its immediately next shift register stage, a drain electrically coupled to the source of the first transistor T1, and a source electrically coupled to the second input node; a third transistor T3 having a gate electrically coupled to the source of the first transistor T1, a drain electrically coupled to the third input node, and a source electrically coupled to the output node; and a control circuit electrically coupled to the first, second and third transistors T1, T2 and T3.

In one embodiment, the control circuit has a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the source of the third transistor T3; a first capacitor C1 electrically coupled between the gate of the third transistor T3 and the output node; and a second capacitor C2 electrically coupled between the third input node and the gate of the seventh transistor T7.

In another embodiment, the control circuit has a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the voltage supply; a eighth transistor T8 having a gate electrically coupled to the third input node, a drain electrically coupled to the gate, and a source electrically coupled to the drain of the fifth transistor T5; a ninth transistor T9 having a gate electrically coupled to the drain of the fifth transistor T5, a drain electrically coupled to the drain of the eighth transistor T8, and a source electrically coupled to the source of the eighth transistor T8; and a first capacitor C1 electrically coupled between the gate of the third transistor T3 and the output node.

In another aspect, the present invention relates to a bidirectional shift register. In one embodiment, a bidirectional shift register includes first, second, third and four control signal bus lines for providing first, second, third and fourth control signals, Bi1, Bi2, Bi3 and Bi4, respectively; and a plurality of shift register stages electrically coupled in serial, each shift register stage having a first input node, a second input node and an output node, wherein the plurality of shift register stages is grouped into 2N sections such that each section comprises a corresponding number of consecutive shift register stages, N being a positive integer greater than one, wherein each section has at least one shift register stage, wherein each shift register stage in each odd section are electrically coupled to the first and second control signal bus lines for receiving the first and second control signals Bi1 and Bi2, and wherein each shift register stage in each even section are electrically coupled to the third and fourth control signal bus lines for receiving the third and fourth control signals Bi3 and Bi4.

In one embodiment, the first and second input nodes of each shift register stage in each (4j+1)-th section are electrically coupled to the first and second control signal bus lines for receiving the first and second control signals Bi1 and Bi2, respectively; the first and second input nodes of each shift register stage in each (4j+3)-th section are electrically coupled to the second and first control signal bus lines for receiving the second and first control signals Bi2 and Bi1, respectively, $j=0, 1, 2, \ldots$; the first and second input nodes of each shift register stage in each (4j+2)-th section are electrically coupled to the third and fourth control signal bus lines for receiving the third and fourth control signals Bi3 and Bi4, respectively, and the first and second input nodes of each shift register stage in each (4j+4)-th section are electrically coupled to the fourth and third control signal bus lines for receiving the fourth and third control signals Bi4 and Bi3, respectively.

In one embodiment, each shift register stage further has third and fourth input nodes configured to receive a first clock signal, CK, and a second clock signal, XCK, respectively, wherein each clock signal comprises an AC signal characterized with a period, $T_{CK}$, and a phase, and the periods of the first and second clock signals are substantially identical, and the phases of the first and second clock signals are substantially reversed, and the period $T_{CK}$ is much shorter than a gate line period, $T_{GL}$, defined by the active scanning time during a frame.

Each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$.

In one embodiment, the first, second, third and fourth control signals Bi1, Bi2, Bi3 and Bi4 are shifted from each other such that the rising time of the first control signal Bi1 is earlier than the beginning of the active scanning time during a frame by S; the rising time of the second control signal Bi2 is later than the falling time of the first control signal Bi1 by $(T_{GL}/4-2S)$; the rising time of the third control signal Bi3 is earlier than the falling time of the second control signal Bi2 by $(T_{GL}/2+2S)$; the rising time of the fourth control signal Bi4 is later than the falling time of the third control signal Bi3 by $(T_{GL}/4-2S)$; and the falling time of the fourth control signal Bi4 is later than the end of the active scanning time during a frame.

In another embodiment, the first, second, third and fourth control signals Bi1, Bi2, Bi3 and Bi4 are shifted from each other such that the rising time of the first control signal Bi1 is later than the beginning of the active scanning time during a frame by ($T_{GL}/4-S$); the rising time of the second control signal Bi2 is later than the falling time of the first control signal Bi1 by ($T_{GL}/4-2S$); the falling time of the second control signal Bi2 is later than the end of the active scanning time during a frame by S; the rising time of the third control signal Bi3 is earlier than the beginning of the active scanning time during a frame by S; and the rising time of the fourth control signal Bi4 is later than the falling time of the third control signal Bi3 by ($T_{GL}/4-2S$).

In one embodiment, each shift register stage comprises a first transistor T1 having a gate electrically coupled to the output node of its immediately prior shift register stage, a drain electrically coupled to the first input node, and a source; a second transistor T2 having a gate electrically coupled to the output node of its immediately next shift register stage, a drain electrically coupled to the source of the first transistor T1, and a source electrically coupled to the second input node; a third transistor T3 having a gate electrically coupled to the source of the first transistor T1, a drain electrically coupled to the third input node, and a source electrically coupled to the output node; a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the source of the third transistor T3; a first capacitor C1 electrically coupled between the gate of the third transistor T3 and the output node; and a second capacitor C2 electrically coupled between the third input node and the gate of the seventh transistor T7.

In another embodiment, each shift register stage comprises a first transistor T1 having a gate electrically coupled to the output node of its immediately prior shift register stage, a drain electrically coupled to the first input node, and a source; a second transistor T2 having a gate electrically coupled to the output node of its immediately next shift register stage, a drain electrically coupled to the source of the first transistor T1, and a source electrically coupled to the second input node; a third transistor T3 having a gate electrically coupled to the source of the first transistor T1, a drain electrically coupled to the third input node, and a source electrically coupled to the output node; a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the voltage supply; a eighth transistor T8 having a gate electrically coupled to the third input node, a drain electrically coupled to the gate, and a source electrically coupled to the drain of the fifth transistor T5; a ninth transistor T9 having a gate electrically coupled to the drain of the fifth transistor T5, a drain electrically coupled to the drain of the eighth transistor T8, and a source electrically coupled to the source of the eighth transistor T8; and a first capacitor C1 electrically coupled between the gate of the third transistor T3 and the output node.

In yet another aspect, the present invention relates to a method of driving a bidirectional shift register having a plurality of shift register stages electrically coupled in serial, each shift register stage having first and second input nodes.

In one embodiment, the method includes the steps of: providing first, second, third and fourth control signals, Bi1, Bi2, Bi3 and Bi4 from first, second, third and four control signal bus lines, respectively; and dividing a plurality of shift register stages into 2N sections such that each section comprises a corresponding number of consecutive shift register stages, N being a positive integer greater than one, wherein each section has at least one shift register stage; and electrically coupling each shift register stage in each odd section to the first and second control signal bus lines for receiving the first and second control signals Bi1 and Bi2, and each shift register stage in each even section to the third and fourth control signal bus lines for receiving the third and fourth control signals Bi3 and Bi4, wherein the coupling step is performed such that the first and second input nodes of each shift register stage in each (4j+1)-th section are electrically coupled to the first and second control signal bus lines for receiving the first and second control signals Bi1 and Bi2, respectively, and the first and second input nodes of each shift register stage in each (4j+3)-th section are electrically coupled to the second and first control signal bus lines for receiving the second and first control signals Bi2 and Bi1, respectively, j=0, 1, 2, . . . ; and the first and second input nodes of each shift register stage in each (4j+2)-th section are electrically coupled to the third and fourth control signal bus lines for receiving the third and fourth control signals Bi3 and Bi4, respectively, and the first and second input nodes of each shift register stage in each (4j+4)-th section are electrically coupled to the fourth and third control signal bus lines for receiving the fourth and third control signals Bi4 and Bi3, respectively.

In one embodiment, the method further comprises the step of providing a first clock signal, CK, and a second clock signal, XCK, where each clock signal comprises an AC signal characterized with a period, $T_{CK}$, and a phase, and wherein the periods of the first and second clock signals are substantially identical, and the phases of the first and second clock signals are substantially reversed, where the period $T_{CK}$ is much shorter than a gate line period, $T_{GL}$, defined by the active scanning time during a frame.

The first, second, third and fourth control signals Bi1, Bi2, Bi3 and Bi4 are adapted for respectively controlling the corresponding sections of the shift register in a forward scanning operation or a backward scanning operation. In one embodiment, each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$.

In one embodiment, the first, second, third and fourth control signals Bi1, Bi2, Bi3 and Bi4 are shifted from each other such that the rising time of the first control signal Bi1 is earlier than the beginning of the active scanning time during a frame by S; the rising time of the second control signal Bi2 is later than the falling time of the first control signal Bi1 by ($T_{GL}/4-2S$); the rising time of the third control signal Bi3 is earlier than the falling time of the second control signal Bi2 by ($T_{GL}/2+2S$); the rising time of the fourth control signal Bi4 is later than the falling time of the third control signal Bi3 by ($T_{GL}/4-2S$); and the falling time of the fourth control signal Bi4 is later than the end of the active scanning time during a frame by S. The shift register is in the forward scanning operation.

In another embodiment, the first, second, third and fourth control signals Bi1, Bi2, Bi3 and Bi4 are shifted from each other such that the rising time of the first control signal Bi1 is later than the beginning of the active scanning time during a frame by ($T_{GL}/4-S$); the rising time of the second control signal Bi2 is later than the falling time of the first control signal Bi1 by ($T_{GL}/4-2S$); the falling time of the second control signal Bi2 is later than the end of the active scanning time during a frame by S; the rising time of the third control signal Bi3 is earlier than the beginning of the active scanning time during a frame by S; and the rising time of the fourth control signal Bi4 is later than the falling time of the third control signal Bi3 by ($T_{GL}/4-2S$). The shift register is in the backward scanning operation.

In a further aspect, the present invention relates to a shift register. In one embodiment, the shift register includes first, second, third and four control signal bus lines for providing first, second, third and fourth control signals, Bi1, Bi2, Bi3 and Bi4, respectively; and a plurality of shift register stages electrically coupled in serial, each shift register stage having a first input node, a second input node and an output node, wherein the plurality of shift register stages is grouped into (2N+1) sections, N being positive integer, wherein each section has at least one shift register stage, wherein each shift register stage in each odd section are electrically coupled to the first and third control signal bus lines for receiving the first and third control signals Bi1 and Bi3, and wherein each shift register stage in each even section are electrically coupled to the second and fourth control signal bus lines for receiving the second and fourth control signals Bi2 and Bi4.

Specifically, the first and second input nodes of each shift register stage in each (4j+1)-th section are electrically coupled to the first and third control signal bus lines for receiving the first and third control signals Bi1 and Bi3, respectively. The first and second input nodes of each shift register stage in each (4j+3)-th section are electrically coupled to the third and first control signal bus lines for receiving the third and first control signals Bi3 and Bi1, respectively, j=0, 1, 2, . . . . The first and second input nodes of each shift register stage in each (4j+2)-th section are electrically coupled to the second and fourth control signal bus lines for receiving the second and fourth control signals Bi2 and Bi4, respectively. The first and second input nodes of each shift register stage in each (4j+4)-th section are electrically coupled to the fourth and second control signal bus lines for receiving the fourth and second control signals Bi4 and Bi2, respectively.

In one embodiment, each shift register stage further has third and fourth input nodes configured to receive a first clock signal, CK, and a second clock signal, XCK, respectively, where each clock signal comprises an AC signal characterized with a period, $T_{CK}$, and a phase, and the periods of the first and second clock signals are substantially identical, and the phases of the first and second clock signals are substantially reversed. The period $T_{CK}$ is much shorter than a gate line period, $T_{GL}$, defined by the active scanning time during a frame.

The first, second, third and fourth control signals Bi1, Bi2, Bi3 and Bi4 are adapted for respectively controlling the corresponding sections of the shift register in a forward scanning operation or a backward scanning operation.

During the forward scanning operation, each of the first, second and third control signals Bi1, Bi2 and Bi3 comprises an AC signal characterized with a waveform having a high level voltage defining a duration, T, and a low level voltage, wherein the duration T satisfies T=($T_{GL}/3+2S$), wherein the first, second and third control signals Bi1, Bi2 and Bi3 are shifted from each other such that the rising time of the first control signal Bi1 is earlier than the beginning of the active scanning time during a frame by S; the rising time of the second control signal Bi2 is earlier than the falling time of the first control signal Bi1 by 2S; the rising time of the third control signal Bi3 is earlier than the falling time of the second control signal Bi2 by 2S; the falling time of the third control signal Bi3 is later than the end of the active scanning time during a frame by S. The fourth control signal Bi4 comprises a DC signal with low level voltage.

During the backward scanning operation, each of the first, third and fourth control signals Bi1, Bi3 and Bi4 comprises an AC signal characterized with a waveform having a high level voltage defining a duration, T, and a low level voltage, wherein the duration T satisfies T=($T_{GL}/3+2S$), wherein the first, third and fourth control signals B11, Bi3 and Bi4 are shifted from each other such that the rising time of the first control signal Bi1 is earlier than the beginning of the active scanning time during a frame by S; the rising time of the fourth control signal Bi4 is earlier than the falling time of the first control signal Bi1 by 2S; the rising time of the third control signal Bi3 is earlier than the falling time of the fourth control signal Bi4 by 2S; the falling time of the third control signal Bi3 is later than the end of the active scanning time during a frame by S. The second control signal Bi2 comprises a DC signal with low level voltage.

Each shift register stage comprises a first transistor T1 having a gate electrically coupled to the output node of its immediately prior shift register stage, a drain electrically coupled to the first input node, and a source; a second transistor T2 having a gate electrically coupled to the output node of its immediately next shift register stage, a drain electrically coupled to the source of the first transistor T1, and a source electrically coupled to the second input node; a third transistor T3 having a gate electrically coupled to the source of the first transistor T1, a drain electrically coupled to the third input node, and a source electrically coupled to the output node; and a control circuit electrically coupled to the first, second and third transistors T1, T2 and T3.

In one embodiment, the control circuit has a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the source of the third transistor T3; a first capacitor C1 electrically coupled between the gate of the third transistor T3 and the output node; and a second capacitor C2 electrically coupled between the third input node and the gate of the seventh transistor T7.

In another embodiment, the control circuit has a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the voltage supply; a eighth transistor T8 having a gate electrically coupled to the third input node, a drain electrically coupled to the gate, and a source electrically coupled to the drain of the fifth transistor T5; a ninth transistor T9 having a gate electrically coupled to the drain of the fifth transistor T5, a drain electrically coupled to the drain of the eighth transistor T8, and a source electrically coupled to the source of the eighth transistor T8; and a first capacitor C1 electrically coupled between the gate of the third transistor T3 and the output node.

In a further aspect, the present invention relates to a method of driving a shift register having a plurality of shift register stages electrically coupled in serial, each shift register stage having first and second input nodes. In one embodiment, the method comprises the steps of providing first, second, third and fourth control signals, Bi1, Bi2, Bi3 and Bi4 from first, second, third and four control signal bus lines, respectively; dividing a plurality of shift register stages into (2N+1) sections, N being positive integer, wherein each section has at least one shift register stage; and electrically coupling each shift register stage in each odd section to the first and third control signal bus lines for receiving the first and third control signals Bi1 and Bi3, and each shift register stage in each even section to the second and fourth control signal bus lines for receiving the second and fourth control signals Bi2 and Bi4.

In one embodiment, the coupling step is performed such that the first and second input nodes of each shift register stage in each (4j+1)-th section are electrically coupled to the first and third control signal bus lines for receiving the first and third control signals Bi1 and Bi3, respectively, and the first and second input nodes of each shift register stage in each (4j+3)-th section are electrically coupled to the third and first control signal bus lines for receiving the third and first control signals Bi3 and Bi1, respectively, j=0, 1, 2, . . . ; and the first and second input nodes of each shift register stage in each (4j+2)-th section are electrically coupled to the second and fourth control signal bus lines for receiving the second and fourth control signals Bi2 and Bi4, respectively, and the first and second input nodes of each shift register stage in each (4j+4)-th section are electrically coupled to the fourth and second control signal bus lines for receiving the fourth and second control signals Bi4 and Bi2, respectively.

The method further comprises the step of providing a first clock signal, CK, and a second clock signal, XCK, wherein each clock signal comprises an AC signal characterized with a period, $T_{CK}$, and a phase, and wherein the periods of the first and second clock signals are substantially identical, and the phases of the first and second clock signals are substantially reversed, wherein the period $T_{CK}$ is much shorter than a gate line period, $T_{GL}$, defined by the active scanning time during a frame.

The first, second, third and fourth control signals Bi1, Bi2, Bi3 and Bi4 are adapted for respectively controlling the corresponding sections of the shift register in a forward scanning operation or a backward scanning operation.

During the forward scanning operation, each of the first, second and third control signals Bi1, Bi2 and Bi3 comprises an AC signal characterized with a waveform having a high level voltage defining a duration, T, and a low level voltage, wherein the duration T satisfies $T=(T_{GL}/3+2S)$, wherein the first, second and third control signals Bi1, Bi2 and Bi3 are shifted from each other such that the rising time of the first control signal Bi1 is earlier than the beginning of the active scanning time during a frame by S; the rising time of the second control signal Bi2 is earlier than the falling time of the first control signal Bi1 by 2S; the rising time of the third control signal Bi3 is earlier than the falling time of the second control signal Bi2 by 2S; the falling time of the third control signal Bi3 is later than the end of the active scanning time during a frame by S. The fourth control signal Bi4 comprises a DC signal with low level voltage.

During the backward scanning operation, each of the first, third and fourth control signals Bi1, Bi3 and Bi4 comprises an AC signal characterized with a waveform having a high level voltage defining a duration, T, and a low level voltage, wherein the duration T satisfies $T=(T_{GL}/3+2S)$, wherein the first, third and fourth control signals Bi1, Bi3 and Bi4 are shifted from each other such that the rising time of the first control signal Bi1 is earlier than the beginning of the active scanning time during a frame by S; the rising time of the fourth control signal Bi4 is earlier than the falling time of the first control signal Bi1 by 2S; the rising time of the third control signal Bi3 is earlier than the falling time of the fourth control signal Bi4 by 2S; the falling time of the third control signal Bi3 is later than the end of the active scanning time during a frame by S. The second control signal Bi2 comprises a DC signal with low level voltage.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
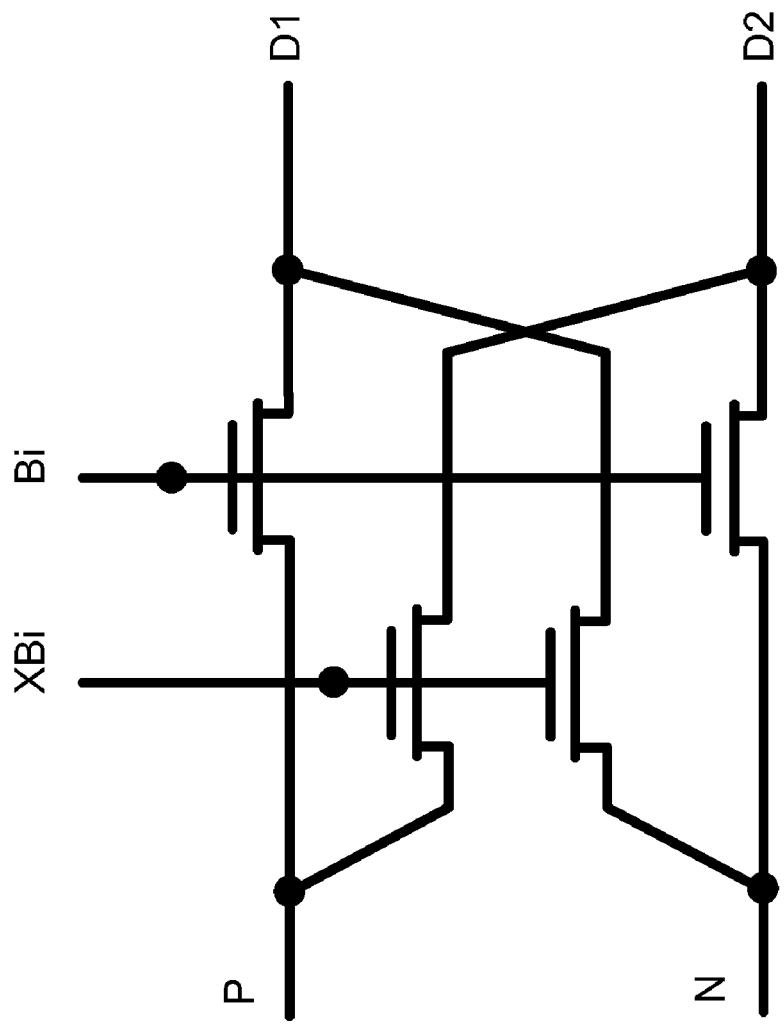
FIG. 1 shows a conventional bidirectional shift register stage.
Figure 2:
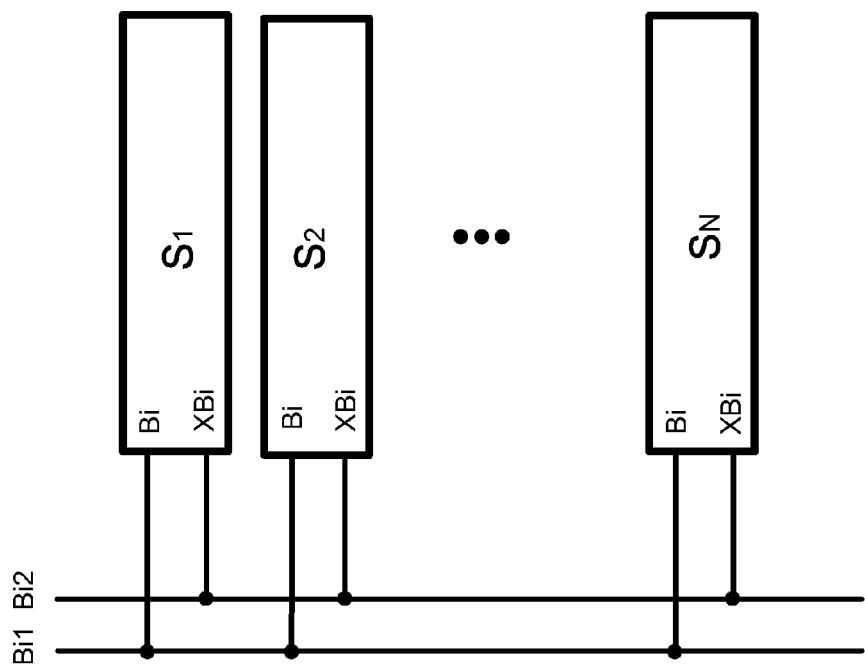
FIG. 2 shows a schematic diagram of a conventional bidirectional shift register.

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification, including examples of any terms discussed herein, is illustrative only, and in no way limits the scope and meaning of the disclosure or of any exemplified term. Likewise, the disclosure is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 3-13. In accordance with the purposes of this invention, as embodied and broadly described herein, this invention, in one aspect, relates to a bidirectional shift register with control signal bus lines connected to respective shift register circuits with embedded bidirectional scanning function.

Figure 3:
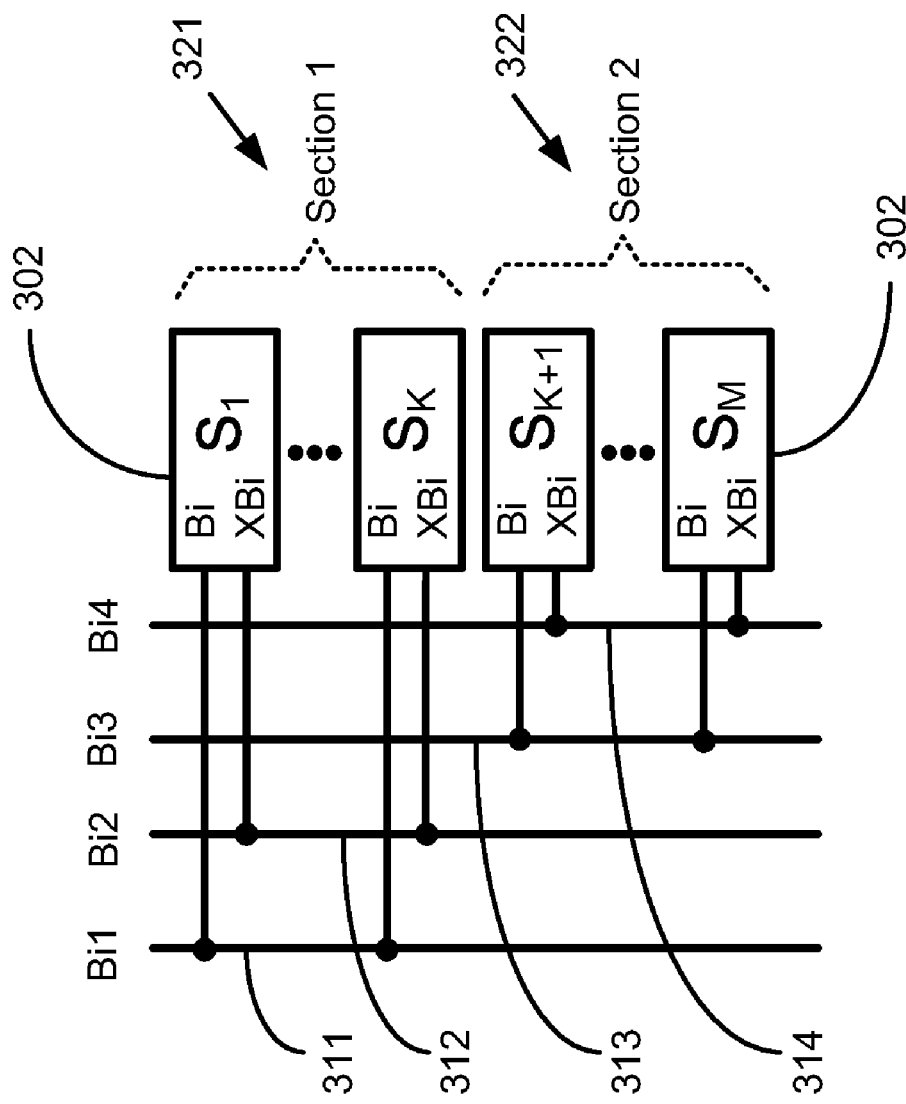
FIG. 3 shows a schematic diagram of a bidirectional shift register according to one embodiment of the present invention.
Figure 4:
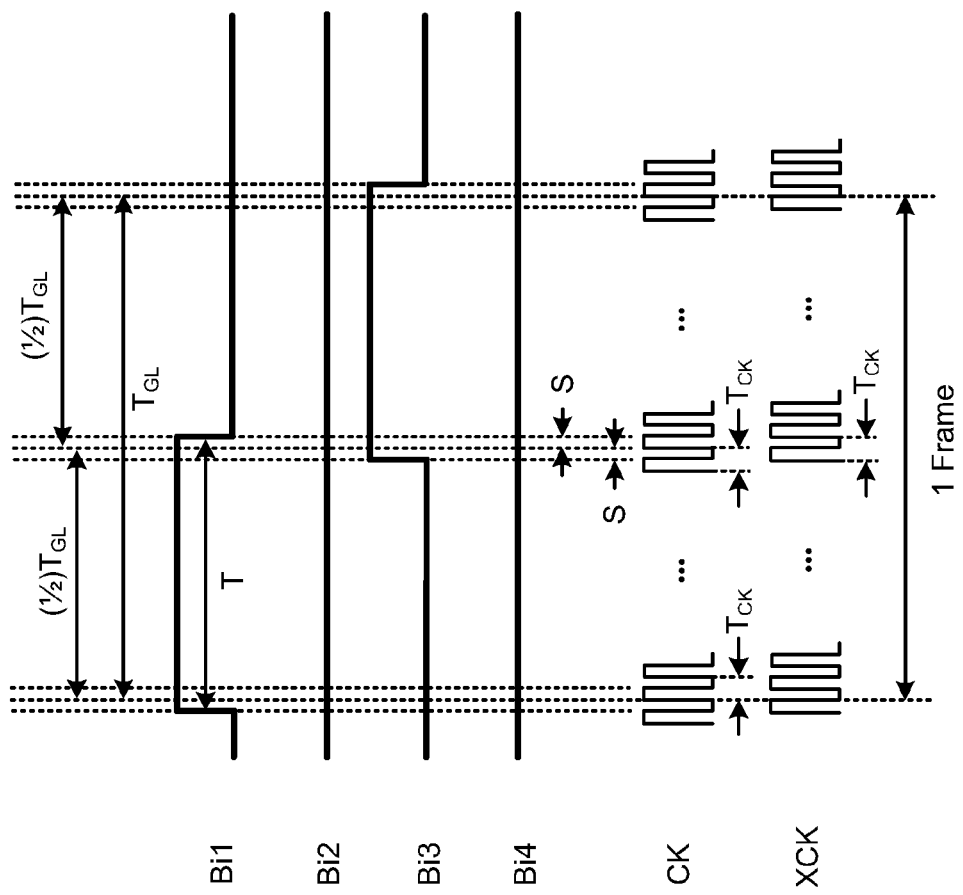
FIG. 4 shows a timing chart of control signals for the bidirectional shift register in a forward scanning operation according to the embodiment of the present invention.
Figure 5:
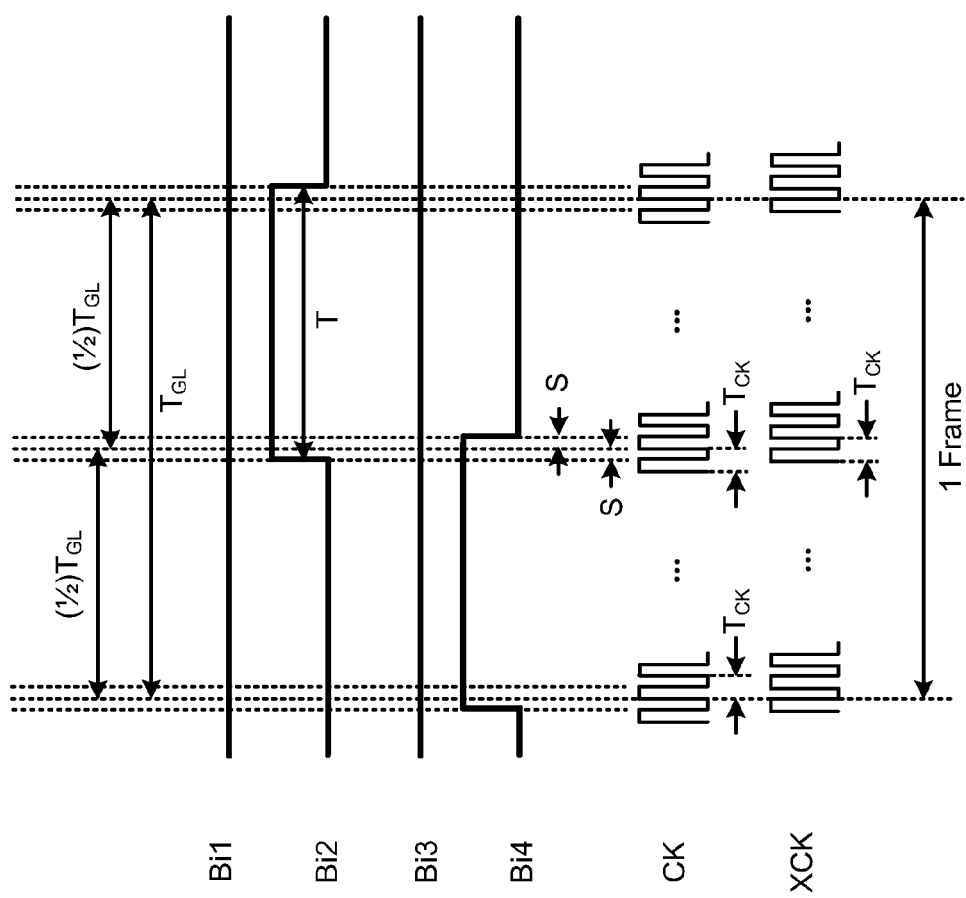
FIG. 5 shows a timing chart of control signals for the bidirectional shift register in a backward/reverse scanning according to the embodiment of the present invention.

Referring in general to FIGS. 3-5, and in particular to FIG. 3, a plurality of bidirectional shift register circuits 302 are grouped into two sections 321 and 322, i.e., a first section 321 and second section 322, according to one embodiment of the present invention. Each of the first and second sections 321 and 322 includes a corresponding number of consecutive shift register circuits 302. For example, the first section 321 has the first shift register circuit $S_1$ through the K-th shift register circuit $S_K$ of the plurality of shift register circuits 302, while the second section 322 has the (K+1)-th shift register circuit $S_{K+1}$ through the M-th shift register circuit $S_M$ of the plurality of shift register circuits 302, where K is an integer greater than 1 but less than the number, M, of the plurality of shift register circuits 302. Each shift register circuit 302 performs a shift operation with respect to each frame period. Each shift register circuit 302 includes a first polarity (input) node Bi and a second polarity (input) node XBi. Each of the first polarity nodes Bi of bidirectional shift register circuits 302 in the first section 321 is connected to a first control signal bus line 311, and controlled by a corresponding control voltage signal Bi1. Each of the second polarity nodes XBi of bidirectional shift register circuits 302 in the first section 321 is connected to a second control signal bus line 312, and controlled by a corresponding control voltage signal Bi2. Each of the first polarity nodes Bi of the bidirectional shift register circuits 302 in the second section 322 is connected to a third control signal line 313, and controlled by a corresponding control voltage signal Bi3. Each of the second polarity nodes XBi of bidirectional shift register circuits 302 in the second section 322 is connected to a fourth control signal bus line 314, and controlled by a corresponding control voltage signal Bi4. The first and second control signals Bi1 and Bi2, and the third and fourth control signals Bi3 and Bi4 are adapted for respectively controlling the first and second sections 321 and 322 of the shift register 302 in a forward scanning operation or a backward scanning operation.

Referring to FIG. 4, a timing diagram illustrates timings of various control voltages during the forward scanning operation for the embodiment as shown in FIG. 3. In the timing diagram, a gate line period, $T_{GL}$, is defined by the active scanning time during a frame, i.e., from the first gate line signal outputs to the last gate line signal outputs in one frame. A voltage signal CK is a clock control signal characterized with a period, $T_{CK}$, and a phase. The time period $T_{CK}$ is defined by the duration of a high level state and a low level state of the clock control signal CK in view of the voltage change. Each of the first and third control signals Bi1 and Bi3 is an AC signal and each of the second and fourth control signals Bi2 and Bi4 is a DC signal with low level voltage. The AC signal is characterized with a waveform having a high level voltage defining a duration, T, and a low level voltage. The duration T satisfies $T=(T_{GL}/2+2S)$. Further, the third control signal Bi3 is shifted from the first control signal Bi1 by $T_{GL}/2$ such that the rising time of the first control signal Bi1 is earlier than the beginning of the active scanning time during a frame by a half of 2S, wherein the 2S is the overlap time between Bi1 and Bi3, and the falling time of the third control signal Bi3 is later than the end of the active scanning time during a frame by a half of the overlap time 2S.

Referring to FIG. 5, a timing diagram illustrates timings of various control voltage signals during the backward (reverse) scanning operation for the embodiment as shown in FIG. 3. In the timing diagram, each of the first and third control signals Bi1 and Bi3 is a DC signal with low level voltage, while each of the second and fourth control signals Bi2 and Bi4 is an AC signal that is characterized with a waveform having a high level voltage defining a duration, T, and a low level voltage, where the duration T satisfies $T=(T_{GL}/2+2S)$. The second control signal Bi2 is shifted from the fourth control signal Bi4 by $T_{GL}/2$ such that the rising time of the fourth control signal Bi4 is earlier than the beginning of the active scanning time during a frame by a half of the overlap time 2S and the falling time of the second control signal Bi2 is later than the end of the active scanning time during a frame by a half of the overlap time 2S.

Figure 6:
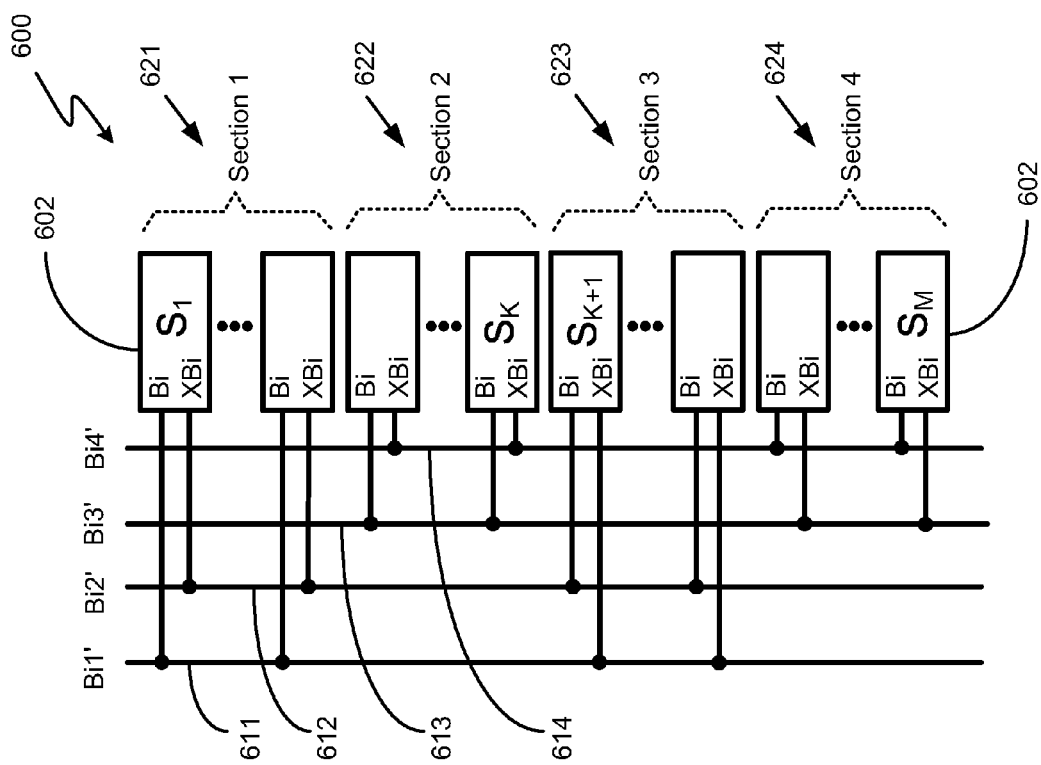
FIG. 6 shows a schematic diagram of a bidirectional shift register according to another embodiment of the present invention.

FIG. 6 shows a schematic diagram of a bidirectional shift register 600 according to another embodiment of the present invention. In this exemplary embodiment, the bidirectional shift register 600 having a plurality of shift register stage 602 are divided into four (4) sections 621, 622, 623 and 624. It would be appreciated to people skilled in the art that the plurality of shift register stage 602 can also be divided into other number of sections according to the present invention. Each section has one or more shift register circuit/stage 602. Each shift register stage 602 has a first polarity input node Bi and a second polarity input node XBi, and performs a shift operation with respect to each frame period. Further, the bidirectional shift register 600 has first, second, third and four control signal bus lines 611, 612, 613 and 614 for providing first, second, third and fourth control signals, Bi1', Bi2', Bi3' and Bi4', respectively. The first, second, third and fourth control signals Bi1', Bi2', Bi3' and Bi4' are adapted for respectively controlling the corresponding sections of the shift register 600 in a forward scanning operation or a backward scanning operation.

According to the present invention, each shift register stage 602 in the first and third sections 621 and 623 is electrically coupled to the first and second control signal bus lines 611 and 612 for receiving the first and second control signals Bi1' and Bi2', while each shift register stage 602 in the second and fourth sections 622 and 624 is electrically coupled to the third and fourth control signal bus lines 613 and 614 for receiving the third and fourth control signals Bi3' and Bi4'. More specifically, the first and second input nodes Bi and XBi of each shift register stage 602 in the first section 621 are electrically coupled to the first and second control signal bus lines 611 and 612 for receiving the first and second control signals Bi1' and Bi2', respectively. The first and second input nodes Bi and XBi of each shift register stage 602 in the third section 623 are electrically coupled to the second and first control signal bus lines 612 and 611 for receiving the second and first control signals Bi2' and Bi1', respectively. The first and second input nodes Bi and XBi of each shift register stage 602 in the second section 622 are electrically coupled to the third and fourth control signal bus lines 613 and 614 for receiving the third and fourth control signals Bi3' and Bi4', respectively. The first and second input nodes Bi and XBi of each shift register stage 602 in the fourth section 424 are electrically coupled to the fourth and third control signal bus lines 614 and 613 for receiving the fourth and third control signals Bi4' and Bi3', respectively.

Figure 7:
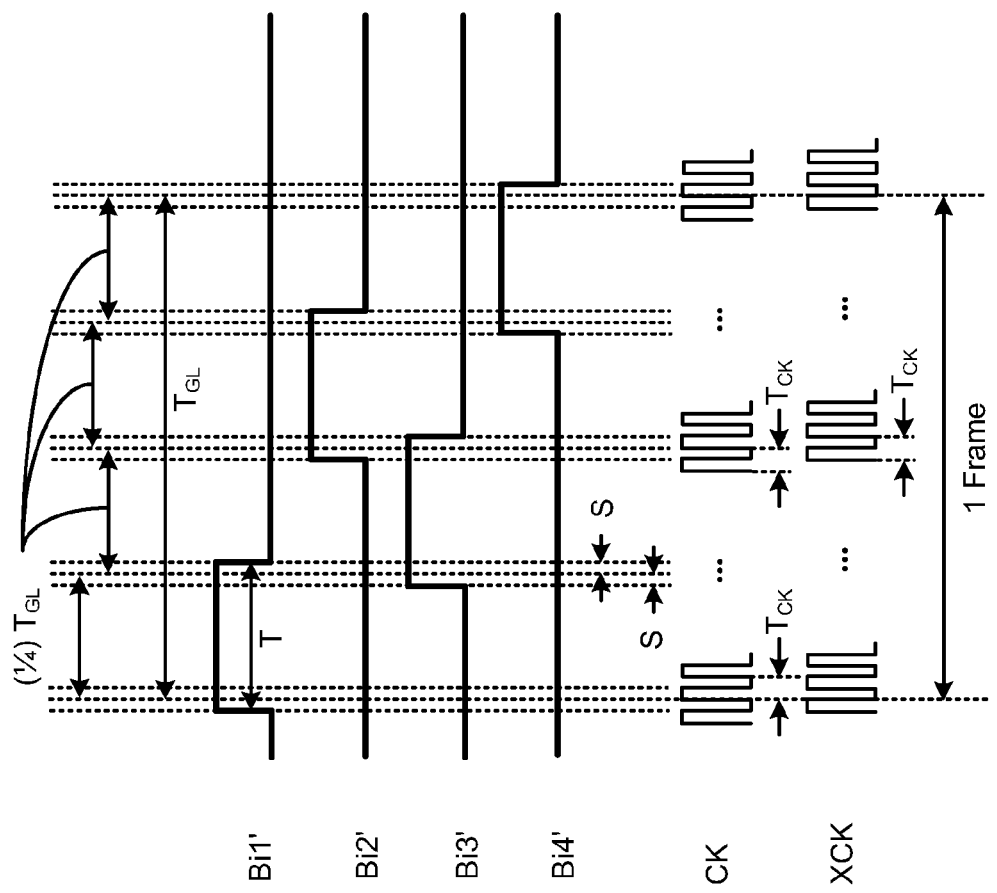
FIG. 7 shows a timing chart of control signals for the bidirectional shift register in a forward scanning operation according to the embodiment of the present invention.

Referring to FIG. 7, a timing diagram illustrates timings of various control voltage signals during the forward scanning operation for the embodiment as shown in FIG. 6. In the timing diagram, a gate line period, $T_{GL}$, is defined by the active scanning time during a frame, i.e., from the first gate line signal outputs to the last gate line signal outputs in one frame. A voltage signal CK is a clock control signal characterized with a period, $T_{CK}$, and a phase. The time period $T_{CK}$ is defined by the duration of a high level state and a low level state of the clock control signal CK in view of the voltage change.

In this embodiment, each of the first, second, third and fourth control signals Bi1', Bi2', Bi3' and Bi4' is an AC signal characterized with a waveform having a high level voltage defining a duration, T, and a low level voltage, where the duration T satisfies $T=(T_{GL}/4+2S)$. Further, the first, second, third and fourth control signals Bi1', Bi2', Bi3' and Bi4" are shifted from each other such that the rising time of the first control signal Bi1' is earlier than the beginning of the active scanning time during a frame by S; the rising time of the second control signal Bi2' is later than the falling time of the first control signal Bi1' by $(T_{GL}/4-2S)$; the rising time of the third control signal Bi3' is earlier than the falling time of the second control signal Bi2' by $(T_{GL}/2+2S)$; the rising time of the fourth control signal Bi4' is later than the falling time of the third control signal Bi3' by $(T_{GL}/4-2S)$; and the falling time of the fourth control signal Bi4' is later than the end of the active scanning time during a frame by S. For such a configuration, during the first one fourth (¼) period of the gate line period $T_{GL}$, the first control signal Bi1' is in the high level voltage; during the second one fourth (¼) period of the gate line period $T_{GL}$, the third control signal Bi3' is in the high level voltage; during the third one fourth (¼) period of the gate line period $T_{GL}$, the second control signal Bi2' is in the high level voltage; and during the fourth one fourth (¼) period of the gate line period $T_{GL}$, the fourth control signal Bi4" is in the high level voltage.

Figure 8:
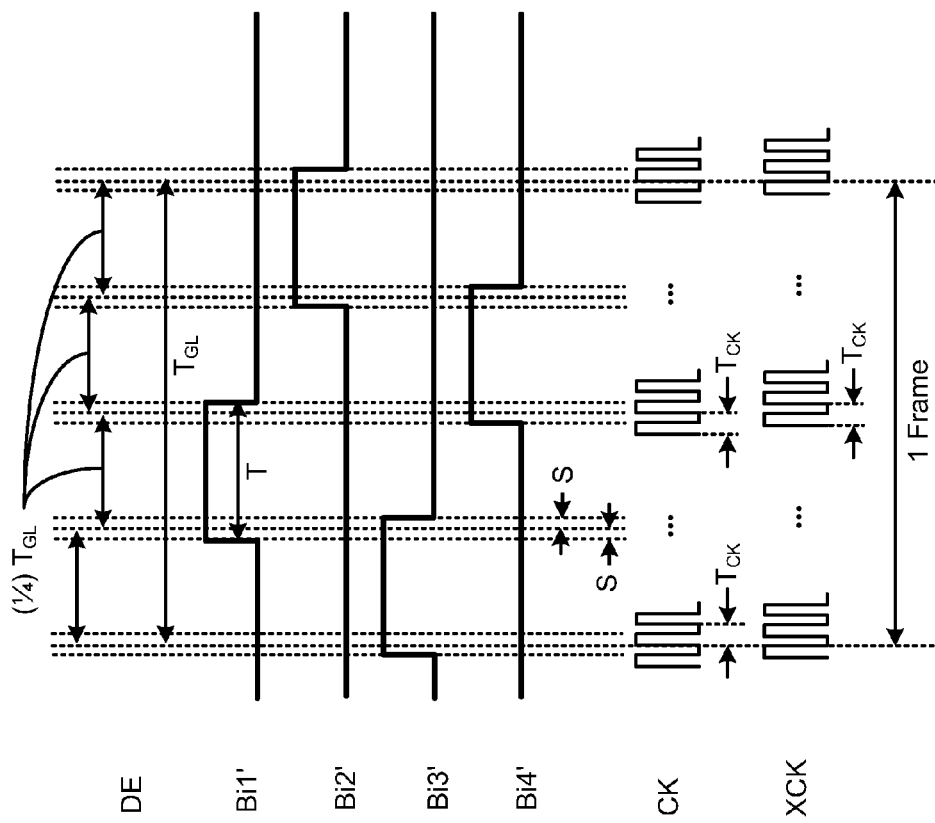
FIG. 8 shows a timing chart of control signals for the bidirectional shift register in a backward/reverse scanning operation according to the embodiment of the present invention.

Referring to FIG. 8, a timing diagram illustrates timings of various control voltage signals during the backward (reverse) scanning operation for the embodiment as shown in FIG. 6. The first, second, third and fourth control signals Bi1', Bi2', Bi3' and Bi4' are shifted from each other such that the rising time of the first control signal Bi1' is later than the beginning of the active scanning time during a frame by $(T_{GL}/4-S)$; the rising time of the second control signal Bi2' is later than the falling time of the first control signal Bi1' by $(T_{GL}/4-2S)$; the falling time of the second control signal Bi2' is later than the end of the active scanning time during a frame by S; the rising time of the third control signal Bi3' is earlier than the beginning of the active scanning time during a frame by S; and the rising time of the fourth control signal Bi4' is later than the falling time of the third control signal Bi3' by $(T_{GL}/4-2S)$. For such a configuration, during the first one fourth (¼) period of the gate line period $T_{GL}$, the third control signal Bi3' is in the high level voltage; during the second one fourth (¼) period of the gate line period $T_{GL}$, the first control signal Bi1' is in the high level voltage; during the third one fourth (¼) period of the gate line period $T_{GL}$, the fourth control signal Bi4' is in the high level voltage; and during the fourth one fourth (¼) period of the gate line period $T_{GL}$, the second control signal Bi2' is in the high level voltage.

Figure 9:
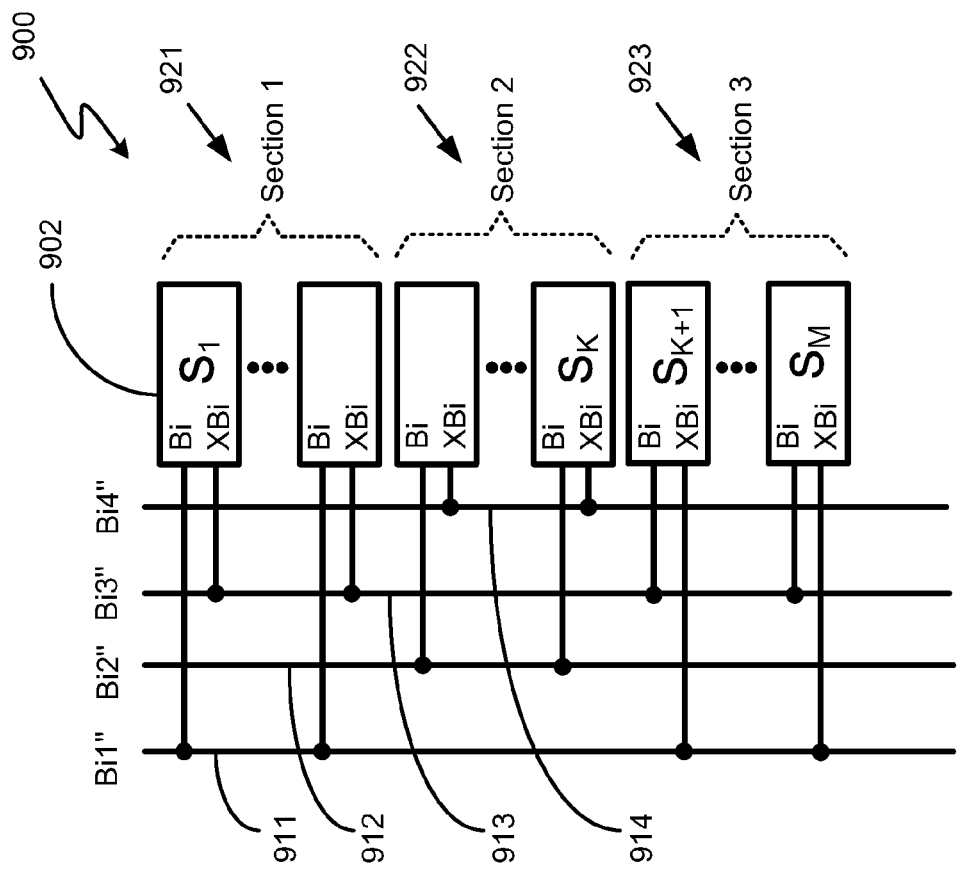
FIG. 9 shows a schematic diagram of a bidirectional shift register according to yet another embodiment of the present invention.

FIG. 9 shows a schematic diagram of a bidirectional shift register 900 according to yet another embodiment of the present invention. In this exemplary embodiment, the bidirectional shift register 900 having a plurality of shift register stage 902 are divided into three (3) sections 921, 922 and 923. It would be appreciated to people skilled in the art that the plurality of shift register stage 902 can also be divided into other number of sections according to the present invention. Each section has one or more shift register circuit/stage 902. Each shift register stage 902 has a first polarity input node Bi and a second polarity input node XBi, and performs a shift operation with respect to each frame period. Further, the bidirectional shift register 900 has first, second, third and four control signal bus lines 911, 912, 913 and 914 for providing first, second, third and fourth control signals, Bi1", Bi2", Bi3" and Bi4", respectively. The first, second, third and fourth control signals Bi1", Bi2", Bi3" and Bi4" are adapted for respectively controlling the corresponding sections of the shift register 900 in a forward scanning operation or a backward scanning operation.

According to the present invention, each shift register stage 902 in the first and third sections 921 and 923 is electrically coupled to the first and third control signal bus lines 911 and 913 for receiving the first and third control signals Bi1" and Bi3", while each shift register stage 902 in the second sections 922 is electrically coupled to the second and fourth control signal bus lines 912 and 914 for receiving the second and fourth control signals Bi2" and Bi4". More specifically, the first and second input nodes Bi and XBi of each shift register stage 902 in the first section 921 are electrically coupled to the first and third control signal bus lines 911 and 913 for receiving the first and third control signals Bi1" and Bi3", respectively. The first and second input nodes Bi and XBi of each shift register stage 902 in the third section 923 are electrically coupled to the third and first control signal bus lines 913 and 911 for receiving the third and first control signals Bi3" and Bi1", respectively. The first and second input nodes Bi and XBi of each shift register stage 902 in the second section 922 are electrically coupled to the second and fourth control signal bus lines 912 and 914 for receiving the second and fourth control signals Bi2" and Bi4", respectively.

Figure 10:
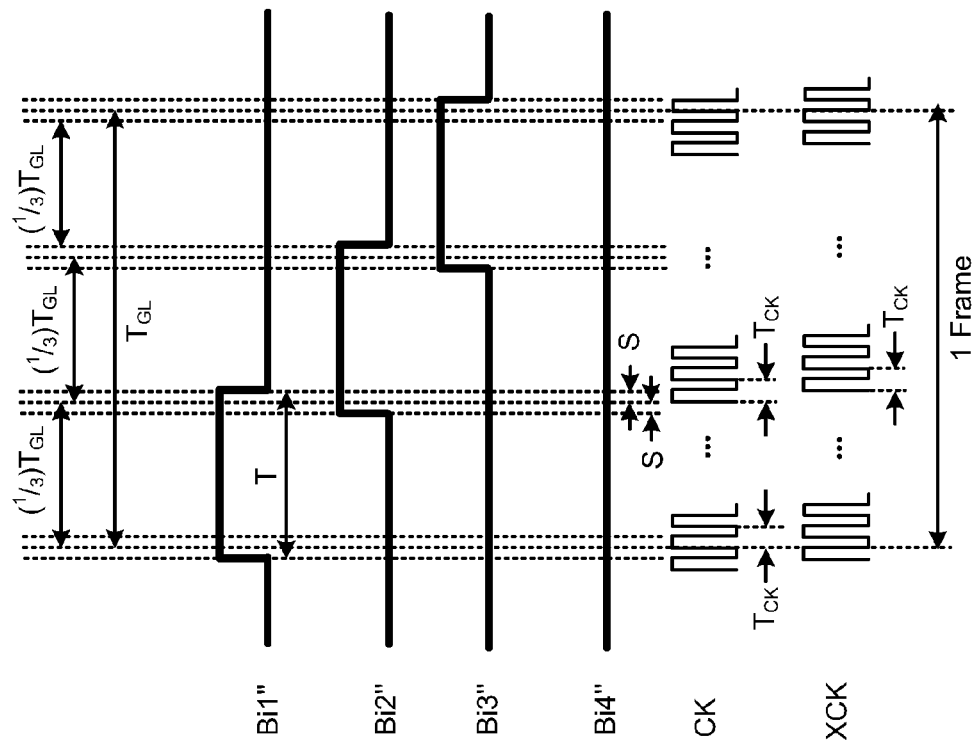
FIG. 10 shows a timing chart of control signals for the bidirectional shift register in a forward scanning operation according to the embodiment of the present invention.

Referring to FIG. 10, a timing diagram illustrates timings of various control voltage signals during the forward scanning operation for the embodiment as shown in FIG. 9. In the timing diagram, a gate line period, $T_{GL}$, is defined by the active scanning time during a frame, i.e., from the first gate line signal outputs to the last gate line signal outputs in one frame. In this embodiment, each of the first, second and third control signals Bi1", Bi2" and Bi3" is an AC signal characterized with a waveform having a high level voltage defining a duration, T, and a low level voltage, where the duration T satisfies $T=(T_{GL}/3+2S)$. Further, the first, second and third control signals Bi1", Bi2" and Bi3" are shifted from each other such that the rising time of the first control signal Bi1" is earlier than the beginning of the active scanning time during a frame by S; the rising time of the second control signal Bi2" is earlier than the falling time of the first control signal Bi1" by 2S; the rising time of the third control signal Bi3" is earlier than the falling time of the second control signal Bi2" by 2S; the falling time of the third control signal Bi3" is later than the end of the active scanning time during a frame by S. The fourth control signal Bi4" comprises a DC signal with low level voltage. For such a configuration, during the first one third (⅓) period of the gate line period $T_{GL}$, the first control signal Bi1" is in the high level voltage; during the second one third (⅓) period of the gate line period $T_{GL}$, the fourth control signal Bi4" is in the high level voltage; and during the third one third (⅓) period of the gate line period $T_{GL}$, the third control signal Bi3" is in the high level voltage.

Figure 11:
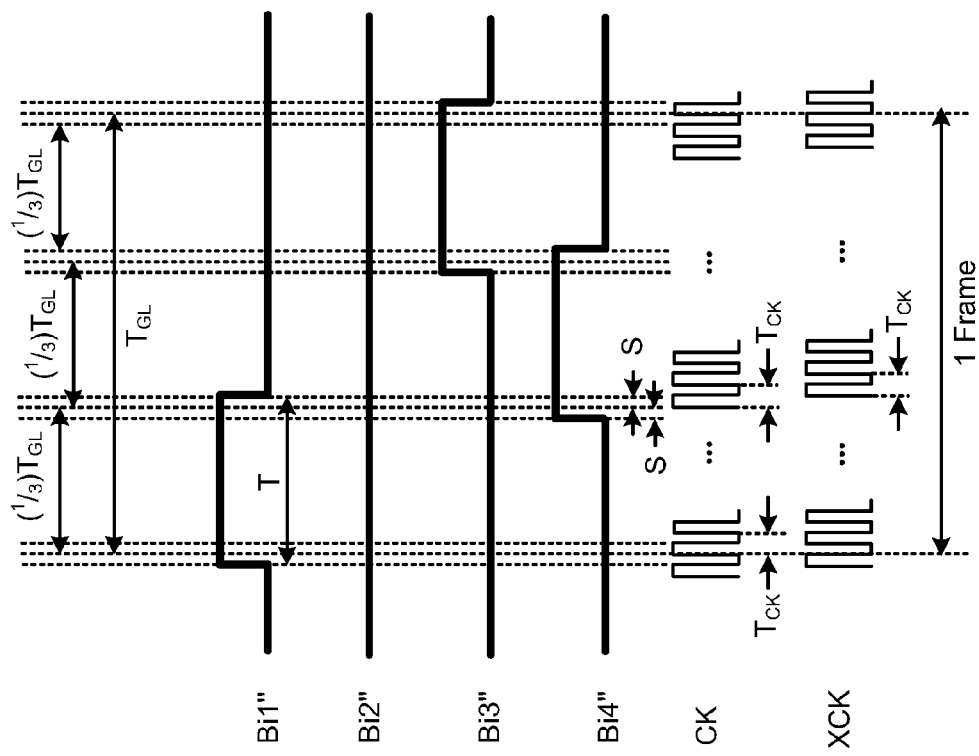
FIG. 11 shows a timing chart of control signals for the bidirectional shift register in a backward/reverse scanning operation according to the embodiment of the present invention.

Referring to FIG. 11, a timing diagram illustrates timings of various control voltage signals during the backward (reverse) scanning operation for the embodiment as shown in FIG. 9. each of the first, third and fourth control signals Bi1", Bi3" and Bi4" comprises an AC signal characterized with a waveform having a high level voltage defining a duration, T, and a low level voltage, wherein the duration T satisfies $T=(T_{GL}/3+2S)$. Further, the first, third and fourth control signals Bi1", Bi3" and Bi4" are shifted from each other such that the rising time of the first control signal Bi1" is earlier than the beginning of the active scanning time during a frame by S; the rising time of the fourth control signal Bi4" is earlier than the falling time of the first control signal Bi1" by 2S; the rising time of the third control signal Bi3" is earlier than the falling time of the fourth control signal Bi4" by 2S; the falling time of the third control signal Bi3" is later than the end of the active scanning time during a frame by S. The second control signal Bi"2 comprises a DC signal with low level voltage. For such a configuration, during the first one third (⅓) period of the gate line period $T_{GL}$, the first control signal Bi1" is in the high level voltage; during the second one third (⅓) period of the gate line period $T_{GL}$, the second control signal Bi2" is in the high level voltage; and during the third one third (⅓) period of the gate line period $T_{GL}$, the third control signal Bi3" is in the high level voltage.

Figure 12:
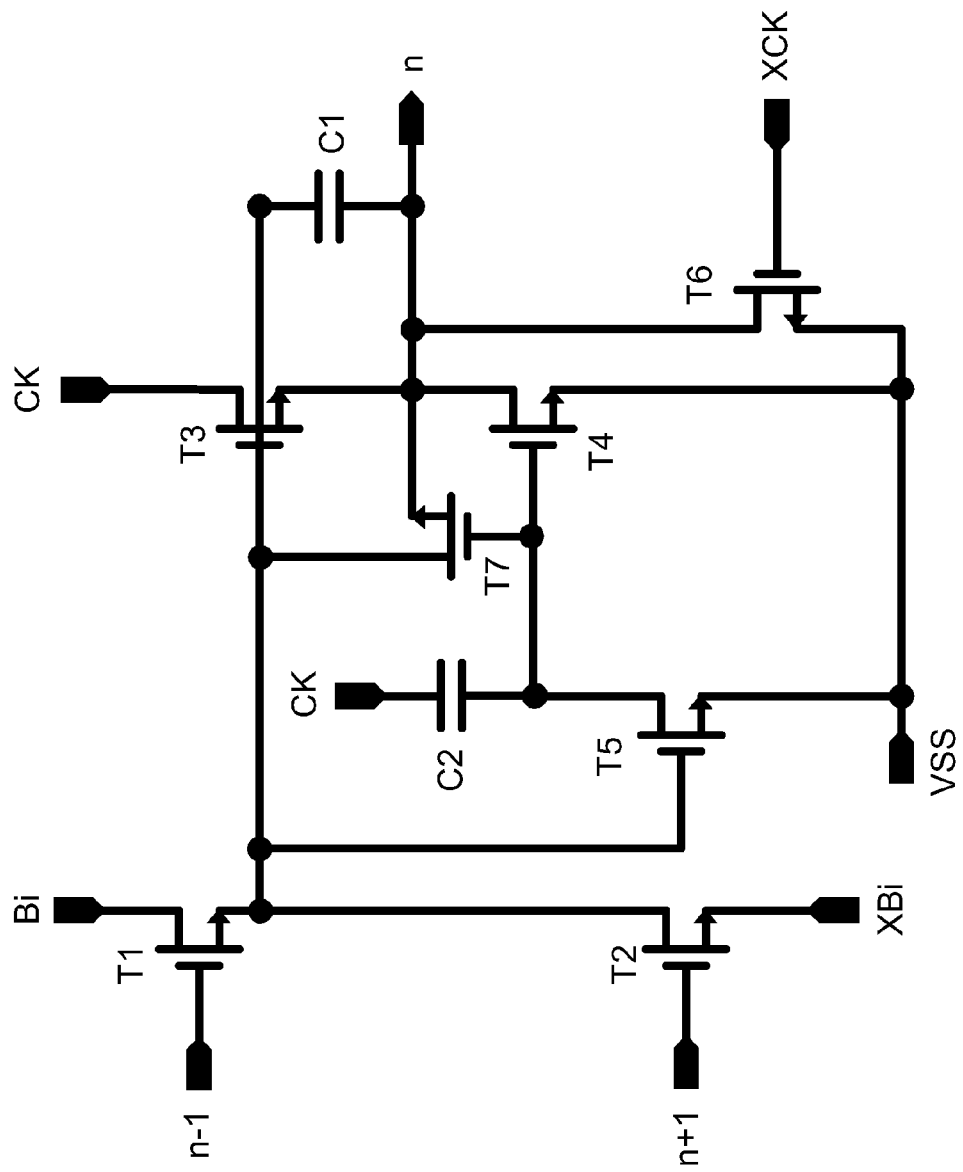
FIG. 12 shows a circuit diagram of a stage of a bidirectional shift register according to one embodiment of the present invention.

FIG. 12 shows a circuit diagram of a stage of a bidirectional shift register according to one embodiment of the present invention. The shift register stage comprises seven transistors T1-T7 and two capacitors C1 and C2. The first transistor T1 has a gate electrically coupled to the output node of its immediately prior shift register stage, a drain electrically coupled to the first input node, and a source. The second transistor T2 has a gate electrically coupled to the output node of its immediately next shift register stage, a drain electrically coupled to the source of the first transistor T1, and a source electrically coupled to the second input node. The third transistor T3 has a gate electrically coupled to the source of the first transistor T1, a drain electrically coupled to the third input node, and a source electrically coupled to the output node. The fourth transistor T4 has a gate, a drain electrically coupled to the source of the third transistor T3, and a source electrically coupled to a voltage supply for receiving a reference voltage, VSS, therefrom. The fifth transistor T5 having a gate electrically coupled to the source of the first transistor T1, a drain electrically coupled to the gate of the fourth transistor T4, and a source electrically coupled to the voltage supply. The sixth transistor T6 has a gate electrically coupled to the fourth input node, a drain electrically coupled to the output node, and a source electrically coupled to the source of the fourth transistor T4. The seventh transistor T7 has a gate electrically coupled to the gate of the fourth transistor T4, a drain electrically coupled to the gate of third transistor T3, and a source electrically coupled to the source of the third transistor T3. The first capacitor C1 is electrically coupled between the gate of the third transistor T3 and the output node. The second capacitor C2 is electrically coupled between the third input node and the gate of the seventh transistor T7.

Figure 13:
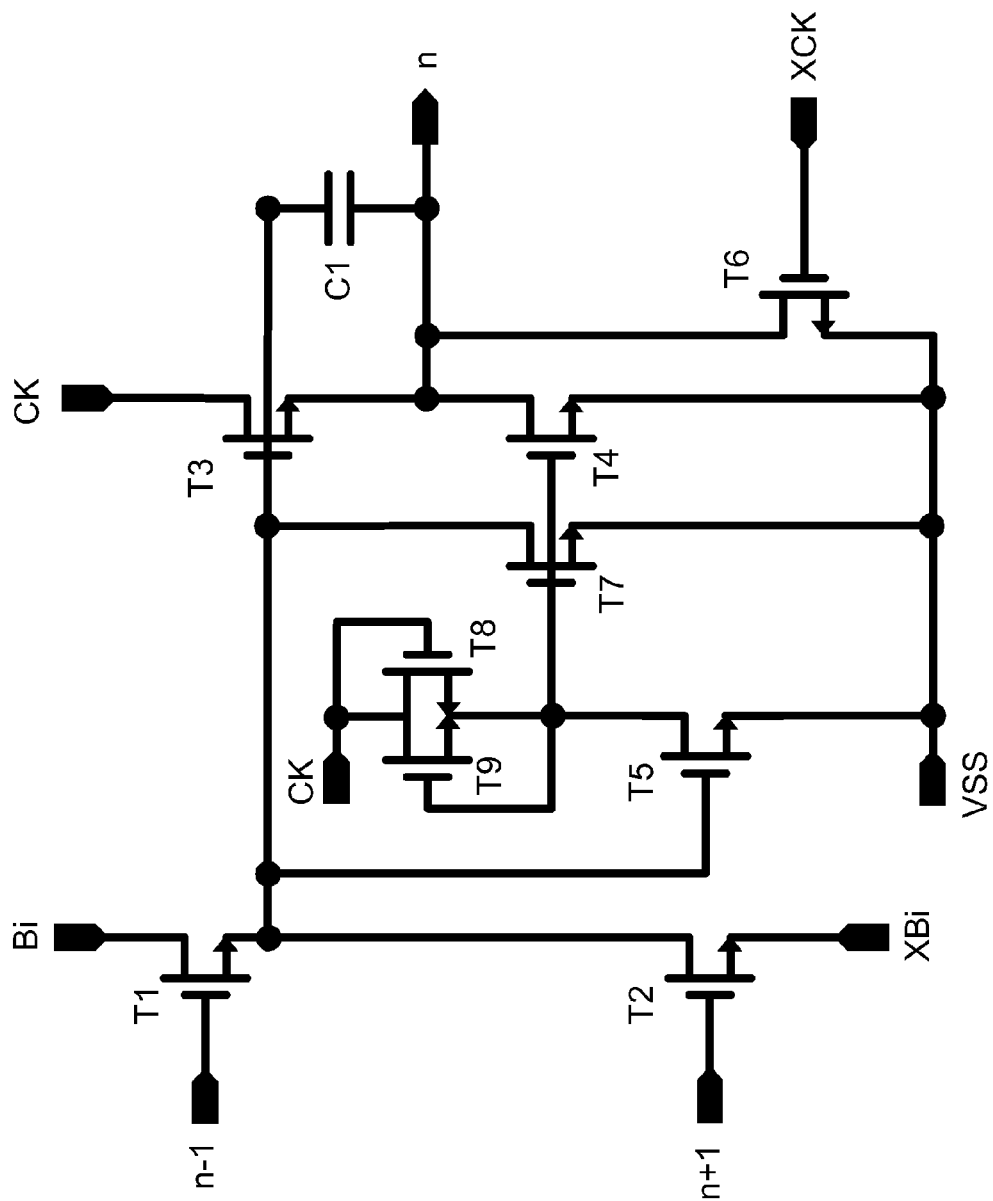
FIG. 13 shows a circuit diagram of a stage of a bidirectional shift register according to another embodiment of the present invention.

In another embodiment, as shown in FIG. 13, the shift register stage comprises a first transistor T1 having a gate electrically coupled to the output node of its immediately prior shift register stage, a drain electrically coupled to the first input node, and a source; a second transistor T2 having a gate electrically coupled to the output node of its immediately next shift register stage, a drain electrically coupled to the source of the first transistor T1, and a source electrically coupled to the second input node; a third transistor T3 having a gate electrically coupled to the source of the first transistor T1, a drain electrically coupled to the third input node, and a source electrically coupled to the output node; a fourth transistor T4 having a gate, a drain electrically coupled to the source of the third transistor T3, and a source electrically coupled to a voltage supply for receiving a reference voltage, VSS, therefrom; a fifth transistor T5 having a gate electrically coupled to the source of the first transistor T1, a drain electrically coupled to the gate of the fourth transistor T4, and a source electrically coupled to the voltage supply; a sixth transistor T6 having a gate electrically coupled to the fourth input node, a drain electrically coupled to the output node, and a source electrically coupled to the source of the fourth transistor T4; a seventh transistor T7 having a gate electrically coupled to the gate of the fourth transistor T4, a drain electrically coupled to the gate of third transistor T3, and a source electrically coupled to the voltage supply; a eighth transistor T8 having a gate electrically coupled to the third input node, a drain electrically coupled to the gate, and a source electrically coupled to the drain of the fifth transistor T5; a ninth transistor T9 having a gate electrically coupled to the drain of the fifth transistor T5, a drain electrically coupled to the drain of the eighth transistor T8, and a source electrically coupled to the source of the eighth transistor T8; and a first capacitor C1 electrically coupled to between the gate of the third transistor T3 and the output node.

One aspect of the present invention relates to a method of driving a bidirectional shift register having a plurality of shift register stages electrically coupled in serial, each shift register stage having first and second input nodes.

The method in one embodiment includes the following steps: first, second, third and fourth control signals, Bi1, Bi2, Bi3 and Bi4 are provided from first, second, third and four control signal bus lines, respectively. The plurality of shift register stages grouped into 2N sections, N being positive integer, where each section has at least one shift register stage. Then, each shift register stage in each odd section is electrically coupling to the first and second control signal bus lines for receiving the first and second control signals Bi1 and Bi2, and each shift register stage in each even section is electrically coupling to the third and fourth control signal bus lines for receiving the third and fourth control signals Bi3 and Bi4. Specifically, the first and second input nodes of each shift register stage in each (4j+1)-th section are electrically coupled to the first and second control signal bus lines for receiving the first and second control signals Bi1 and Bi2, respectively, and the first and second input nodes of each shift register stage in each (4j+3)-th section are electrically coupled to the second and first control signal bus lines for receiving the second and first control signals Bi2 and Bi1, respectively, j=0, 1, 2, . . . ; and the first and second input nodes of each shift register stage in each (4j+2)-th section are electrically coupled to the third and fourth control signal bus lines for receiving the third and fourth control signals Bi3 and Bi4, respectively, and the first and second input nodes of each shift register stage in each (4j+4)-th section are electrically coupled to the fourth and third control signal bus lines for receiving the fourth and third control signals Bi4 and Bi3, respectively.

The method further includes the step of providing a first clock signal, CK, and a second clock signal, XCK, where each clock signal comprises an AC signal characterized with a period, $T_{CK}$, and a phase, and wherein the periods of the first and second clock signals are substantially identical, and the phases of the first and second clock signals are substantially reversed. The period $T_{CK}$ is much shorter than a gate line period, $T_{GL}$, defined by the active scanning time during a frame.

Further, each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$.

In one embodiment, the first, second, third and fourth control signals Bi1, Bi2, Bi3 and Bi4 are shifted from each other such that the rising time of the first control signal Bi1 is earlier than the beginning of the active scanning time during a frame by S; the rising time of the second control signal Bi2 is later than the falling time of the first control signal Bi1 by $(T_{GL}/4-2S)$; the rising time of the third control signal Bi3 is earlier than the falling time of the second control signal Bi2 by $(T_{GL}/2+2S)$; the rising time of the fourth control signal Bi4 is later than the falling time of the third control signal Bi3 by $(T_{GL}/4-2S)$; and the falling time of the fourth control signal Bi4 is later than the end of the active scanning time during a frame by S. Accordingly, the shift register is in the forward scanning operation In another embodiment, the first, second, third and fourth control signals Bi1, Bi2, Bi3 and Bi4 are shifted from each other such that the rising time of the first control signal Bi1 is later than the beginning of the active scanning time during a frame by $(T_{GL}/4-S)$; the rising time of the second control signal Bi2 is later than the falling time of the first control signal Bi1 by $(T_{GL}/4-2S)$; the falling time of the second control signal Bi2 is later than the end of the active scanning time during a frame by S; the rising time of the third control signal Bi3 is earlier than the beginning of the active scanning time during a frame by S; and the rising time of the fourth control signal Bi4 is later than the falling time of the third control signal Bi3 by $(T_{GL}/4-2S)$. Accordingly, the shift register is in the backward scanning operation.

Another aspect of the present invention relates to a method of driving a shift register having a plurality of shift register stages electrically coupled in serial, each shift register stage having first and second input nodes. In one embodiment, the method comprises the steps of providing first, second, third and fourth control signals, Bi1, Bi2, Bi3 and Bi4 from first, second, third and four control signal bus lines, respectively; dividing a plurality of shift register stages into (2N+1) sections, N being positive integer, wherein each section has at least one shift register stage; and electrically coupling each shift register stage in each odd section to the first and third control signal bus lines for receiving the first and third control signals Bi1 and Bi3, and each shift register stage in each even section to the second and fourth control signal bus lines for receiving the second and fourth control signals Bi2 and Bi4.

Further, the coupling step is performed such that the first and second input nodes of each shift register stage in each (4j+1)-th section are electrically coupled to the first and third control signal bus lines for receiving the first and third control signals Bi1 and Bi3, respectively, and the first and second input nodes of each shift register stage in each (4j+3)-th section are electrically coupled to the third and first control signal bus lines for receiving the third and first control signals Bi3 and Bi1, respectively, j=0, 1, 2, . . . ; and the first and second input nodes of each shift register stage in each (4j+2)-th section are electrically coupled to the second and fourth control signal bus lines for receiving the second and fourth control signals Bi2 and Bi4, respectively, and the first and second input nodes of each shift register stage in each (4j+4)-th section are electrically coupled to the fourth and second control signal bus lines for receiving the fourth and second control signals Bi4 and Bi2, respectively.

The first, second, third and fourth control signals Bi1, Bi2, Bi3 and Bi4 are adapted for respectively controlling the corresponding sections of the shift register in a forward scanning operation or a backward scanning operation.

During the forward scanning operation, each of the first, second and third control signals Bi1, Bi2 and Bi3 comprises an AC signal characterized with a waveform having a high level voltage defining a duration, T, and a low level voltage, wherein the duration T satisfies $T=(T_{GL}/3+2S)$, wherein the first, second and third control signals Bi1, Bi2 and Bi3 are shifted from each other such that the rising time of the first control signal Bi1 is earlier than the beginning of the active scanning time during a frame by S; the rising time of the second control signal Bi2 is earlier than the falling time of the first control signal Bi1 by 2S; the rising time of the third control signal Bi3 is earlier than the falling time of the second control signal Bi2 by 2S; the falling time of the third control signal Bi3 is later than the end of the active scanning time during a frame by S. The fourth control signal Bi4 comprises a DC signal with low level voltage.

During the backward scanning operation, each of the first, third and fourth control signals Bi1, Bi3 and Bi4 comprises an AC signal characterized with a waveform having a high level voltage defining a duration, T, and a low level voltage, wherein the duration T satisfies $T=(T_{GL}/3+2S)$, wherein the first, third and fourth control signals Bi1, Bi3 and Bi4 are shifted from each other such that the rising time of the first control signal Bi1 is earlier than the beginning of the active scanning time during a frame by S; the rising time of the fourth control signal Bi4 is earlier than the falling time of the first control signal Bi1 by 2S; the rising time of the third control signal Bi3 is earlier than the falling time of the fourth control signal Bi4 by 2S; the falling time of the third control signal Bi3 is later than the end of the active scanning time during a frame by S. The second control signal Bi2 comprises a DC signal with low level voltage.

With the aid of the control signals in the disclosed bidirectional shift register, low frequency exchange is enabled and bidirectional scanning is maintained, thereby reducing voltage stress and enhance reliability.

The foregoing description of the exemplary embodiment of the invention has been presented only for the purposes of illustration and description and is not intended to be exhaustive or to limit the invention to the precise forms disclosed. Many modifications and variations are possible in light of the above teaching.

The embodiment and related configurations were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. A shift register, comprising:
    first, second, third and four control signal bus lines for providing first, second, third and fourth control signals, Bi1, Bi2, Bi3 and Bi4, respectively; and
    a plurality of shift register stages electrically coupled in serial, each shift register stage having a first input node, a second input node and an output node, wherein the plurality of shift register stages is grouped into L sections such that each section comprises a corresponding number of consecutive shift register stages, L being a positive integer greater than three, wherein each section has at least two consecutive shift register stages, wherein the first and second input nodes of each shift register stage in each odd section are electrically and respectively coupled to two control signal bus lines of the first, second, third and fourth control signal bus lines for receiving corresponding two control signals of the first, second, third and fourth control signals, Bi1, Bi2, Bi3 and Bi4 provided from the two control signal bus lines, and wherein the first and second input nodes of each shift register stage in each even section are electrically and respectively coupled to the other two control signal bus lines of the first, second, third and fourth control signal bus lines for receiving the other two control signals of the first, second, third and fourth control signals, Bi1, Bi2, Bi3 and Bi4 provided from the other two control signal bus lines.

2. The shift register of claim 1,
    wherein the first and second input nodes of each shift register stage in each (4j+1)-th section are electrically coupled to the first and second control signal bus lines for receiving the first and second control signals Bi1 and Bi2, respectively, wherein the first and second input nodes of each shift register stage in each (4j+3)-th section are electrically coupled to the second and first control signal bus lines for receiving the second and first control signals Bi2 and Bi1, respectively, j=0, 1, 2, . . . ; and
    wherein the first and second input nodes of each shift register stage in each (4j+2)-th section are electrically coupled to the third and fourth control signal bus lines for receiving the third and fourth control signals Bi3 and Bi4, respectively, wherein the first and second input nodes of each shift register stage in each (4j+4)-th section are electrically coupled to the fourth and third control signal bus lines for receiving the fourth and third control signals Bi4 and Bi3, respectively.

3. The shift register of claim 1, wherein each shift register stage further has third and fourth input nodes configured to receive a first clock signal, CK, and a second clock signal, XCK, respectively, wherein each clock signal comprises an AC signal characterized with a period, $T_{CK}$, and a phase, and wherein the periods of the first and second clock signals are substantially identical, and the phases of the first and second clock signals are substantially reversed, wherein the period $T_{CK}$ is much shorter than a gate line period, $T_{GL}$, defined by the active scanning time during a frame.

4. The shift register of claim 3, wherein the first, second, third and fourth control signals Bi1, Bi2, Bi3 and Bi4 are adapted for respectively controlling the corresponding sections of the shift register in a forward scanning operation or a backward scanning operation.

5. The shift register of claim 4, wherein each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$, S being a half of an overlap time between the high level voltage duration of the first control signal Bi1 and the high level voltage duration of the third control signal Bi3.

6. The shift register of claim 5, wherein during the forward scanning operation, the first, second, third and fourth control signals Bi1, Bi2, Bi3 and Bi4 are shifted from each other such that
    the rising time of the first control signal Bi1 is earlier than the beginning of the active scanning time during a frame by S;
    the rising time of the second control signal Bi2 is later than the falling time of the first control signal Bi1 by $(T_{GL}/4-2S)$;
    the rising time of the third control signal Bi3 is earlier than the falling time of the second control signal Bi2 by $(T_{GL}/2+2S)$;
    the rising time of the fourth control signal Bi4 is later than the falling time of the third control signal Bi3 by $(T_{GL}/4-2S)$; and
    the falling time of the fourth control signal Bi4 is later than the end of the active scanning time during a frame by S.

7. The shift register of claim 5, wherein during the backward scanning operation, the first, second, third and fourth control signals Bi1, Bi2, Bi3 and Bi4 are shifted from each other such that the rising time of the first control signal Bi1 is later than the beginning of the active scanning time during a frame by ($T_{GL}/4-S$);

the rising time of the second control signal Bi2 is later than the falling time of the first control signal Bi1 by ($T_{GL}/4-2S$);

the falling time of the second control signal Bi2 is later than the end of the active scanning time during a frame by S;

the rising time of the third control signal Bi3 is earlier than the beginning of the active scanning time during a frame by S; and the rising time of the fourth control signal Bi4 is later than the falling time of the third control signal Bi3 by ($T_{GL}/4-2S$).

8. The shift register of claim 3 wherein each shift register stage comprises:

a first transistor T1 having a gate electrically coupled to the output node of its immediately prior shift register stage, a drain electrically coupled to the first input node, and a source;

a second transistor T2 having a gate electrically coupled to the output node of its immediately next shift register stage, a drain electrically coupled to the source of the first transistor T1, and a source electrically coupled to the second input node;

a third transistor T3 having a gate electrically coupled to the source of the first transistor T1, a drain electrically coupled to the third input node, and a source electrically coupled to the output node; and a control circuit electrically coupled to the first, second and third transistors T1, T2 and T3.

9. The shift register of claim 1, wherein the first and second input nodes of each shift register stage in each (4j+1)-th section are electrically coupled to the first and third control signal bus lines for receiving the first and third control signals Bi1 and Bi3, respectively, wherein the first and second input nodes of each shift register stage in each (4j+3)-th section are electrically coupled to the third and first control signal bus lines for receiving the third and first control signals Bi3 and Bi1, respectively, j=0, 1, 2, . . . ; and wherein the first and second input nodes of each shift register stage in each (4j+2)-th section are electrically coupled to the second and fourth control signal bus lines for receiving the second and fourth control signals Bi2 and Bi4, respectively, wherein the first and second input nodes of each shift register stage in each (4j+4)-th section are electrically coupled to the fourth and second control signal bus lines for receiving the fourth and second control signals Bi4 and Bi2, respectively.

10. The shift register of claim 4, wherein during the forward scanning operation, each of the first, second and third control signals Bi1, Bi2 and Bi3 comprises an AC signal characterized with a waveform having a high level voltage defining a duration, T, and a low level voltage, wherein the duration T satisfies T=($T_{GL}/3+2S$), S being a half of an overlap time between the high level voltage duration of the first control signal Bi1 and the high level voltage duration of the second control signal Bi2, wherein the first, second and third control signals Bi1, Bi2 and Bi3 are shifted from each other such that the rising time of the first control signal Bi1 is earlier than the beginning of the active scanning time during a frame by S;

the rising time of the second control signal Bi2 is earlier than the falling time of the first control signal Bi1 by 2S;

the rising time of the third control signal Bi3 is earlier than the falling time of the second control signal Bi2 by 2S;

the falling time of the third control signal Bi3 is later than the end of the active scanning time during a frame by S; and wherein the fourth control signal Bi4 comprises a DC signal with low level voltage.

11. The shift register of claim 4, wherein during the backward scanning operation, each of the first, third and fourth control signals Bi1, Bi3 and Bi4 comprises an AC signal characterized with a waveform having a high level voltage defining a duration, T, and a low level voltage, wherein the duration T satisfies T=($T_{GL}/3+2S$), S being a half of an overlap time between the high level voltage duration of the first control signal Bi1 and the high level voltage duration of the fourth control signal Bi4, wherein the first, third and fourth control signals Bi1, Bi3 and Bi4 are shifted from each other such that the rising time of the first control signal Bi1 is earlier than the beginning of the active scanning time during a frame by S;

the rising time of the fourth control signal Bi4 is earlier than the falling time of the first control signal Bi1 by 2S;

the rising time of the third control signal Bi3 is earlier than the falling time of the fourth control signal Bi4 by 2S;

the falling time of the third control signal Bi3 is later than the end of the active scanning time during a frame by S; and wherein the second control signal Bi2 comprises a DC signal with low level voltage.

12. A method of driving a shift register having a plurality of shift register stages electrically coupled in serial, each shift register stage having first, second, third and fourth input nodes, comprising the steps of:

providing first, second, third and fourth control signals, Bi1, Bi2, Bi3 and Bi4 from first, second, third and four control signal bus lines, respectively; and dividing a plurality of shift register stages into L sections such that each section comprises a corresponding number of consecutive shift register stages, L being a positive integer greater than three, wherein each section has at least two consecutive shift register stages; and electrically and respectively coupling the first and second input nodes of each shift register stage in each odd section to two control signal bus lines of the first, second, third and fourth control signal bus lines for receiving corresponding two control signals of the first, second, third and fourth control signals, Bi1, Bi2, Bi3 and Bi4 provided from the two control signal bus lines, and the first and second input nodes of each shift register stage in each even section to the other two control signal bus lines of the first, second, third and fourth control signal bus lines for receiving the other two control signals of the first, second, third and fourth control signals, Bi1, Bi2, Bi3 and Bi4 provided from the other two control signal bus lines.

13. The method of claim 12, wherein the coupling step is performed such that the first and second input nodes of each shift register stage in each (4j+1)-th section are electrically coupled to the first and second control signal bus lines for receiving the first and second control signals Bi1 and Bi2, respectively, and the first and second input nodes of each shift register stage in each (4j+3)-th section are electrically coupled to the second and first control signal bus lines for receiving the second and first control signals Bi2 and Bi1, respectively, j=0, 1, 2, . . . ; and the first and second input nodes of each shift register stage in each (4j+2)-th section are electrically coupled to the third and fourth control signal bus lines for receiving the third and fourth control signals Bi3 and Bi4, respectively, and the first and second input nodes of each shift register stage in each (4j+4)-th section are electrically coupled to the fourth and third control signal bus lines for receiving the fourth and third control signals Bi4 and Bi3, respectively.

14. The method of claim 12, further comprising the step of providing a first clock signal, CK, and a second clock signal, XCK, to the third and fourth input nodes of each shift register stage, respectively, wherein each clock signal comprises an AC signal characterized with a period, $T_{CK}$, and a phase, and wherein the periods of the first and second clock signals are substantially identical, and the phases of the first and second clock signals are substantially reversed, wherein the period $T_{CK}$ is much shorter than a gate line period, $T_{GL}$, defined by the active scanning time during a frame.

15. The method of claim 14, wherein the first, second, third and fourth control signals Bi1, Bi2, Bi3 and Bi4 are adapted for respectively controlling the corresponding sections of the shift register in a forward scanning operation or a backward scanning operation.

16. The method of claim 15, wherein each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$, S being a half of an overlap time between the high level voltage duration of the first control signal Bi1 and the high level voltage duration of the third control signal Bi3.

17. The method of claim 16, wherein the first, second, third and fourth control signals Bi1, Bi2, Bi3 and Bi4 are shifted from each other such that the rising time of the first control signal Bi1 is earlier than the beginning of the active scanning time during a frame by S;

the rising time of the second control signal Bi2 is later than the falling time of the first control signal Bi1 by $(T_{GL}/4-2S)$;

the rising time of the third control signal Bi3 is earlier than the falling time of the second control signal Bi2 by $(T_{GL}/2+2S)$;

the rising time of the fourth control signal Bi4 is later than the falling time of the third control signal Bi3 by $(T_{GL}/4-2S)$; and the falling time of the fourth control signal Bi4 is later than the end of the active scanning time during a frame by S; and wherein the shift register is in the forward scanning operation.

18. The method of claim 16, wherein the first, second, third and fourth control signals Bi1, Bi2, Bi3 and Bi4 are shifted from each other such that the rising time of the first control signal Bi1 is later than the beginning of the active scanning time during a frame by $(T_{GL}/4-S)$;

the rising time of the second control signal Bi2 is later than the falling time of the first control signal Bi1 by $(T_{GL}/4-2S)$;

the falling time of the second control signal Bi2 is later than the end of the active scanning time during a frame by S;

the rising time of the third control signal Bi3 is earlier than the beginning of the active scanning time during a frame by S; and the rising time of the fourth control signal Bi4 is later than the falling time of the third control signal Bi3 by $(T_{GL}/4-2S)$; and wherein the shift register is in the backward scanning operation.

19. The method of claim 12, wherein the coupling step is performed such that the first and second input nodes of each shift register stage in each (4j+1)-th section are electrically coupled to the first and third control signal bus lines for receiving the first and third control signals Bi1 and Bi3, respectively, and the first and second input nodes of each shift register stage in each (4j+3)-th section are electrically coupled to the third and first control signal bus lines for receiving the third and first control signals Bi3 and Bi1, respectively, j=0, 1, 2, . . . ; and the first and second input nodes of each shift register stage in each (4j+2)-th section are electrically coupled to the second and fourth control signal bus lines for receiving the second and fourth control signals Bi2 and Bi4, respectively, and the first and second input nodes of each shift register stage in each (4j+4)-th section are electrically coupled to the fourth and second control signal bus lines for receiving the fourth and second control signals Bi4 and Bi2, respectively.

20. The method of claim 15, wherein during the forward scanning operation, each of the first, second and third control signals Bi1, Bi2 and Bi3 comprises an AC signal characterized with a waveform having a high level voltage defining a duration, T, and a low level voltage, wherein the duration T satisfies $T=(T_{GL}/3+2S)$, S being a half of an overlap time between the high level voltage duration of the first control signal Bi1 and the high level voltage duration of the second control signal Bi2, wherein the first, second and third control signals Bi1, Bi2 and Bi3 are shifted from each other such that the rising time of the first control signal Bi1 is earlier than the beginning of the active scanning time during a frame by S;

the rising time of the second control signal Bi2 is earlier than the falling time of the first control signal Bi1 by 2S;

the rising time of the third control signal Bi3 is earlier than the falling time of the second control signal Bi2 by 2S;

the falling time of the third control signal Bi3 is later than the end of the active scanning time during a frame by S; and wherein the fourth control signal Bi4 comprises a DC signal with low level voltage.

21. The method of claim 15, wherein during the backward scanning operation, each of the first, third and fourth control signals Bi1, Bi3 and Bi4 comprises an AC signal characterized with a waveform having a high level voltage defining a duration, T, and a low level voltage, wherein the duration T satisfies $T=(T_{GL}/3+2S)$, S being a half of an overlap time between the high level voltage duration of the first control signal Bi1 and the high level voltage duration of the fourth control signal Bi4, wherein the first, third and fourth control signals Bi1, Bi3 and Bi4 are shifted from each other such that the rising time of the first control signal Bi1 is earlier than the beginning of the active scanning time during a frame by S;

the rising time of the fourth control signal Bi4 is earlier than the falling time of the first control signal Bi1 by 2S;

the rising time of the third control signal Bi3 is earlier than the falling time of the fourth control signal Bi4 by 2S;

the falling time of the third control signal Bi3 is later than the end of the active scanning time during a frame by S; and wherein the second control signal Bi2 comprises a DC signal with low level voltage.

22. A shift register, comprising:

first, second, third and four control signal bus lines for providing first, second, third and fourth control signals, Bi1, Bi2, Bi3 and Bi4, respectively; and a plurality of shift register stages electrically coupled in serial, each shift register stage having a first input node, a second input node and an output node, wherein the plurality of shift register stages is grouped into L sections such that each section comprises a corresponding number of consecutive shift register stages, L being a positive integer greater than three, wherein each section has at least one shift register stage, wherein the first and second input nodes of each shift register stage in each odd section are electrically and respectively coupled to two control signal bus lines of the first, second, third and fourth control signal bus lines for receiving corresponding two control signals of the first, second, third and fourth control signals, Bi1, Bi2, Bi3 and Bi4 provided from the two control signal bus lines, and wherein the first and second input nodes of each shift register stage in each even section are electrically and respectively coupled to the other two control signal bus lines of the first, second, third and fourth control signal bus lines for receiving the other two control signals of the first, second, third and fourth control signals, Bi1, Bi2, Bi3 and Bi4 provided from the other two control signal bus lines, wherein each shift register stage further has third and fourth input nodes configured to receive a first clock signal, CK, and a second clock signal, XCK, respectively, wherein each clock signal comprises an AC signal characterized with a period, $T_{CK}$, and a phase, and wherein the periods of the first and second clock signals are substantially identical, and the phases of the first and second clock signals are substantially reversed, wherein the period $T_{CK}$ is much shorter than a gate line period, $T_{GL}$, defined by the active scanning time during a frame, wherein the first, second, third and fourth control signals Bi1, Bi2, Bi3 and Bi4 are adapted for respectively controlling the corresponding sections of the shift register in a forward scanning operation or a backward scanning operation;

wherein each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$, S being a half of an overlap time between the high level voltage duration of the first control signal Bi1 and the high level voltage duration of the third control signal Bi3.

23. The shift register of claim 22, wherein during the forward scanning operation, the first, second, third and fourth control signals Bi1, Bi2, Bi3 and Bi4 are shifted from each other such that the rising time of the first control signal Bi1 is earlier than the beginning of the active scanning time during a frame by S;

the rising time of the second control signal Bi2 is later than the falling time of the first control signal Bi1 by $(T_{GL}/4-2S)$;

the rising time of the third control signal Bi3 is earlier than the falling time of the second control signal Bi2 by $(T_{GL}/2+2S)$;

the rising time of the fourth control signal Bi4 is later than the falling time of the third control signal Bi3 by $(T_{GL}/4-2S)$; and the falling time of the fourth control signal Bi4 is later than the end of the active scanning time during a frame by S.

24. The shift register of claim 22, wherein the first and second input nodes of each shift register stage in each (4j+1)-th section are electrically coupled to the first and second control signal bus lines for receiving the first and second control signals Bi1 and Bi2, respectively, wherein the first and second input nodes of each shift register stage in each (4j+3)-th section are electrically coupled to the second and first control signal bus lines for receiving the second and first control signals Bi2 and Bi1, respectively, j=0, 1, 2, . . . ; and wherein the first and second input nodes of each shift register stage in each (4j+2)-th section are electrically coupled to the third and fourth control signal bus lines for receiving the third and fourth control signals Bi3 and Bi4, respectively, wherein the first and second input nodes of each shift register stage in each (4j+4)-th section are electrically coupled to the fourth and third control signal bus lines for receiving the fourth and third control signals Bi4 and Bi3, respectively.

25. A method of driving a shift register having a plurality of shift register stages electrically coupled in serial, each shift register stage having first, second, third and fourth input nodes, comprising the steps of:

providing first, second, third and fourth control signals, Bi1, Bi2, Bi3 and Bi4 from first, second, third and four control signal bus lines, respectively; and dividing a plurality of shift register stages into L sections such that each section comprises a corresponding number of consecutive shift register stages, L being a positive integer greater than three, wherein each section has at least one shift register stage; and electrically and respectively coupling the first and second input nodes of each shift register stage in each odd section to two control signal bus lines of the first, second, third and fourth control signal bus lines for receiving corresponding two control signals of the first, second, third and fourth control signals, Bi1, Bi2, Bi3 and Bi4 provided from the two control signal bus lines, and the first and second input nodes of each shift register stage in each even section to the other two control signal bus lines of the first, second, third and fourth control signal bus lines for receiving the other two control signals of the first, second, third and fourth control signals, Bi1, Bi2, Bi3 and Bi4 provided from the other two control signal bus lines, providing a first clock signal, CK, and a second clock signal, XCK, to the third and fourth input nodes of each shift register stage, respectively, wherein each clock signal comprises an AC signal characterized with a period, $T_{CK}$, and a phase, and wherein the periods of the first and second clock signals are substantially identical, and the phases of the first and second clock signals are substantially reversed, wherein the period $T_{CK}$ is much shorter than a gate line period, $T_{GL}$, defined by the active scanning time during a frame, wherein the first, second, third and fourth control signals Bi1, Bi2, Bi3 and Bi4 are adapted for respectively controlling the corresponding sections of the shift register in a forward scanning operation or a backward scanning operation; and wherein each of the first, second, third and fourth control signals Bi1, Bi2, Bi3 and Bi4 comprises an AC signal characterized with a waveform having a high level voltage defining a duration, T, and a low level voltage, wherein the duration T satisfies $T=(T_{GL}/4+2S)$, S being a half of an overlap time between the high level voltage duration of the first control signal Bi1 and the high level voltage duration of the third control signal Bi3.

26. The method of claim 25, wherein the first, second, third and fourth control signals Bi1, Bi2, Bi3 and Bi4 are shifted from each other such that the rising time of the first control signal Bi1 is earlier than the beginning of the active scanning time during a frame by S;

the rising time of the second control signal Bi2 is later than the falling time of the first control signal Bi1 by $(T_{GL}/4-2S)$;

the rising time of the third control signal Bi3 is earlier than the falling time of the second control signal Bi2 by $(T_{GL}/2+2S)$;

the rising time of the fourth control signal Bi4 is later than the falling time of the third control signal Bi3 by $(T_{GL}/4-2S)$; and the falling time of the fourth control signal Bi4 is later than the end of the active scanning time during a frame by S; and wherein the shift register is in the forward scanning operation.

27. The method of claim 25, wherein the coupling step is performed such that the first and second input nodes of each shift register stage in each (4j+1)-th section are electrically coupled to the first and second control signal bus lines for receiving the first and second control signals Bi1 and Bi2, respectively, and the first and second input nodes of each shift register stage in each (4j+3)-th section are electrically coupled to the second and first control signal bus lines for receiving the second and first control signals Bi2 and Bi1, respectively, j=0, 1, 2, . . . ; and the first and second input nodes of each shift register stage in each (4j+2)-th section are electrically coupled to the third and fourth control signal bus lines for receiving the third and fourth control signals Bi3 and Bi4, respectively, and the first and second input nodes of each shift register stage in each (4j+4)-th section are electrically coupled to the fourth and third control signal bus lines for receiving the fourth and third control signals Bi4 and Bi3, respectively.

* * * * *